United States Patent
Matsutori

(10) Patent No.: US 11,501,990 B2
(45) Date of Patent: Nov. 15, 2022

(54) SUBSTRATE STORING CONTAINER

(71) Applicant: MIRAIAL CO., LTD., Tokyo (JP)

(72) Inventor: Chiaki Matsutori, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 310 days.

(21) Appl. No.: 16/475,630

(22) PCT Filed: Jun. 12, 2018

(86) PCT No.: PCT/JP2018/022461
§ 371 (c)(1),
(2) Date: Jul. 2, 2019

(87) PCT Pub. No.: WO2019/239495
PCT Pub. Date: Dec. 19, 2019

(65) Prior Publication Data
US 2020/0286759 A1 Sep. 10, 2020

(51) Int. Cl.
*H01L 21/67* (2006.01)
*H01L 21/673* (2006.01)
(Continued)

(52) U.S. Cl.
CPC ........ *H01L 21/67373* (2013.01); *B65D 43/02* (2013.01); *E05C 9/042* (2013.01);
(Continued)

(58) Field of Classification Search
CPC ......... H01L 21/67373; H01L 21/67265; H01L 21/6732; H01L 21/67346; H01L 21/67369;
(Continued)

(56) References Cited

U.S. PATENT DOCUMENTS 6,105,782 A * 8/2000 Fujimori ........... H01L 21/67373
206/710
9,514,971 B2 12/2016 Phark et al.
(Continued)

FOREIGN PATENT DOCUMENTS

JP 2003-174080 6/2003
JP 2006-351604 12/2006
(Continued)

OTHER PUBLICATIONS

Office Action dated Oct. 21, 2019 in TW Application No. 108119418.

*Primary Examiner* — Mohammed Shamsuzzaman
(74) *Attorney, Agent, or Firm* — Muncy, Geissler, Olds & Lowe, P.C.

(57) ABSTRACT

Provided is a substrate storing container in which a latching mechanism includes an engagement latch 32, an engagement latch lifting/lowering cam 35 that causes the engagement latch 32 to advance to and retreat from an engagement concave portion and causes the engagement latch 32 in the engagement concave portion to move toward/away from the other end portion of a container main body by advancing and retreating in a direction in which the engagement latch 32 advances and retreats, and a rotating cam 31, and the engagement latch lifting/lowering cam 35 includes an engagement latch connection portion 357 that causes the engagement latch 32 to be engaged with the engagement concave portion and thereafter causes the engagement latch 32 to approach the other end portion of the container main body by moving in a direction in which the engagement latch 32 approaches the engagement concave portion.

5 Claims, 14 Drawing Sheets

(51) Int. Cl.
*B65D 43/02* (2006.01)
*E05C 9/04* (2006.01)

(52) U.S. Cl.
CPC .... *H01L 21/6732* (2013.01); *H01L 21/67265* (2013.01); *H01L 21/67346* (2013.01); *H01L 21/67369* (2013.01); *H01L 21/67379* (2013.01); *H01L 21/67383* (2013.01)

(58) Field of Classification Search
CPC ........ H01L 21/67379; H01L 21/67383; B65D 43/02; B65D 81/05; B65D 85/38; E05C 9/042
See application file for complete search history.

(56) References Cited

U.S. PATENT DOCUMENTS

| | | | | |
|---|---|---|---|---|
| 2005/0133402 | A1* | 6/2005 | Matsutori | H01L 21/67373 220/323 |
| 2005/0161367 | A1* | 7/2005 | Matsutori | H01L 21/67369 206/711 |
| 2006/0138143 | A1* | 6/2006 | Matsutori | H01L 21/67373 220/323 |
| 2006/0278564 | A1* | 12/2006 | Obayashi | H01L 21/67379 206/832 |
| 2007/0080096 | A1* | 4/2007 | Miyajima | H01L 21/67126 206/710 |
| 2009/0026109 | A1* | 1/2009 | Hasegawa | H01L 21/67373 206/711 |
| 2010/0206767 | A1* | 8/2010 | Odashima | H01L 21/67379 206/710 |
| 2015/0318195 | A1* | 11/2015 | Ohnuki | B65D 43/22 206/710 |

FOREIGN PATENT DOCUMENTS

| | | |
|---|---|---|
| JP | 4716671 | 7/2011 |
| JP | 4739033 | 8/2011 |
| JP | 2013-004852 | 1/2013 |
| WO | WO 2006/114981 | 11/2006 |
| WO | WO 2015/033411 | 3/2015 |

* cited by examiner

SUBSTRATE STORING CONTAINER

TECHNICAL FIELD

The present invention relates to a substrate storing container used for storing, accommodating, conveying, transporting, or the like a substrate formed of a semiconductor wafer or the like.

BACKGROUND ART

As a substrate storing container for storing a substrate formed of a semiconductor wafer and conveying the substrate in a process in a factory, one has been known conventionally that has a configuration including a container main body and a lid body (for example, refer to Patent Documents 1 to 3).

One end portion of the container main body has an opening circumferential portion at which a container main body opening portion is formed. The other end portion of the container main body has a tubular wall portion which is closed. A substrate Storing space is formed in the container main body. The substrate storing space is formed to be surrounded by the wall portion and can store a plurality of substrates. The lid body can be removably attached to the opening circumferential portion and can close the container main body opening portion. Lateral substrate support portions are provided at the wall portion so as to form a pair in the substrate storing space. When the container main body opening portion is not closed by the lid body, the lateral substrate support portions can support edge portions of the plurality of substrates in a state in which adjacent substrates are arranged in parallel to be spaced apart by a predetermined interval.

A front retainer is provided at a part of the lid body at a part which faces the substrate storing space when the container main body opening portion is closed. When the container main body opening portion is closed by the lid body, the front retainer can support the edge portions of the plurality of substrates. In addition, a back side substrate support portion is provided at the wall portion so as to form a pair with the front retainer. The back side substrate support portion can support the edge portions of the plurality of substrates. When the container main body opening portion is closed by the lid body, the back side substrate support portion retains the plurality of substrates in a state in which adjacent substrates are arranged in parallel to be spaced apart by a predetermined interval, by supporting the plurality of substrates in cooperation with the front retainer.

Patent Document 1: Japanese Patent No. 4716671
Patent Document 2: Japanese Patent No. 4739033
Patent Document 3: U.S. Pat. No. 9,514,971

DISCLOSURE OF THE INVENTION

Problems to be Solved by the Invention

In a conventional lid body, a latching mechanism is provided. The latching mechanism is provided in the vicinity of both left and right end portions of the lid body, and includes two upper side latch portions that can project upward from an upper side of the lid body and two lower side latch portions that can project downward from a lower side of the lid body. The upper side latches and the lower side latches are engaged with latch engagement concave portions formed in a container main body, so that the lid body is fixed to an opening circumferential portion of the container main body.

An operation portion is provided on an outer face of the lid body. The operation portion has a latch rotating member. As the latch rotating member is rotated, a latch arm which abuts a cam portion provided in the latch rotating member advances to and retreats from the latch rotating member such that the upper side latches and the lower side latches which are tip end parts of the latch arm are brought into a state of projecting from the upper side and the lower side of the lid body or a state of not projecting from the upper aide and the lower side.

However, in a conventional substrate storing container, while the latch rotating member is rotated, the cam portion of the latch rotating member slides with respect to the latch arm. Furthermore, the latch arm is subjected to not only the operation of advancing to and retreating from the latch rotating member but also a so-called lifting/lowering operation (push-in operation) of causing the lid body to be pushed in the container main body by the cam portion. Therefore, a predetermined rotational force for rotating the latch rotating member is required, and it is preferable to rotate the latch rotating member with less rotational force.

An object of the present invention is to provide a substrate storing container capable of rotating a latch rotating member of an operation portion of a lid body with less rotational force.

Means for Solving the Problems

The present invention relates to a substrate storing container including: a container main body having formed inside thereof a substrate storing space that can store a plurality of substrates, and having formed at one end portion thereof an opening circumferential portion at which a container main body opening portion that is in communication with the substrate storing space is formed; and a lid body that is removably attached to the opening circumferential portion and can close the container main body opening portion in a positional relationship surrounded by the opening circumferential portion, in which the opening circumferential portion includes at least a pair of engagement concave portions that has a positional relationship opposite to each other and is formed to face the lid body, the lid body includes a lid body main body, and at least a pair of latching mechanisms that is able to move with respect to the lid body main body between an engagement position where the latching mechanisms are respectively engaged with at least the pair of engagement concave portions to fix the lid body main body to the container main body, and a disengagement position where engagement with the engagement concave portions is released and fixing of the lid body main body to the container main body is released, when the container main body opening portion is closed by the lid body, the latching mechanism includes engagement latches that are engaged/disengaged by advancing to and retreating from the engagement concave portions and move toward/away from the other end portion with respect to the one end portion of the container main body in the engagement concave portions, engagement latch lifting/lowering cams that cause the engagement latches to advance to and retreat from the engagement concave portions and cause the engagement latches in the engagement concave portions to move toward/away from the other end portion of the container main body by advancing and retreating in a direction in which the engagement latches advance and retreat, and a rotating cam that causes the engagement latch lifting/lowering cams to advance and retreat in the direction in which the engagement latches advance and retreat by rotating, and the engagement latch lifting/lowering cams include engagement latch connection portions that cause the engagement latches to be engaged with the engagement concave portions and thereafter cause the engagement latches to approach the other end portion of the container main body by moving in a direction in which the engagement latches approach the engagement concave portions.

In addition, it is preferable that a locking roller which is engaged with and locked to the engagement concave portion is provided in a tip end portion of the engagement latch.

In addition, it is preferable that the lid body has a substantially rectangular plate shape having a lid body outer face and a lid body inner face, a bottom portion of the engagement concave portion has a V shape in a section parallel to the lid body outer face or the lid body inner face, and a part which is a part of a tip end portion of the engagement latch and abuts a part of an engagement concave portion forming portion of the opening circumferential portion forming the bottom portion of the engagement concave portion when the engagement latch is in the engagement position has a V-shaped end face that matches the bottom portion of the engagement concave portion. In addition, it is preferable that a tip end portion of the engagement latch is made of a material having a low coefficient of static friction. In addition, it is preferable that the tip end portion of the engagement latch has a low coefficient of static friction by being subjected to embossment.

Effects of the Invention

According to the present invention, it is possible to provide a substrate storing container capable of rotating a latch rotating member of an operation portion of a lid body with less rotational force.

PREFERRED NODE FOR CARRYING OUT THE INVENTION

Figure 1:
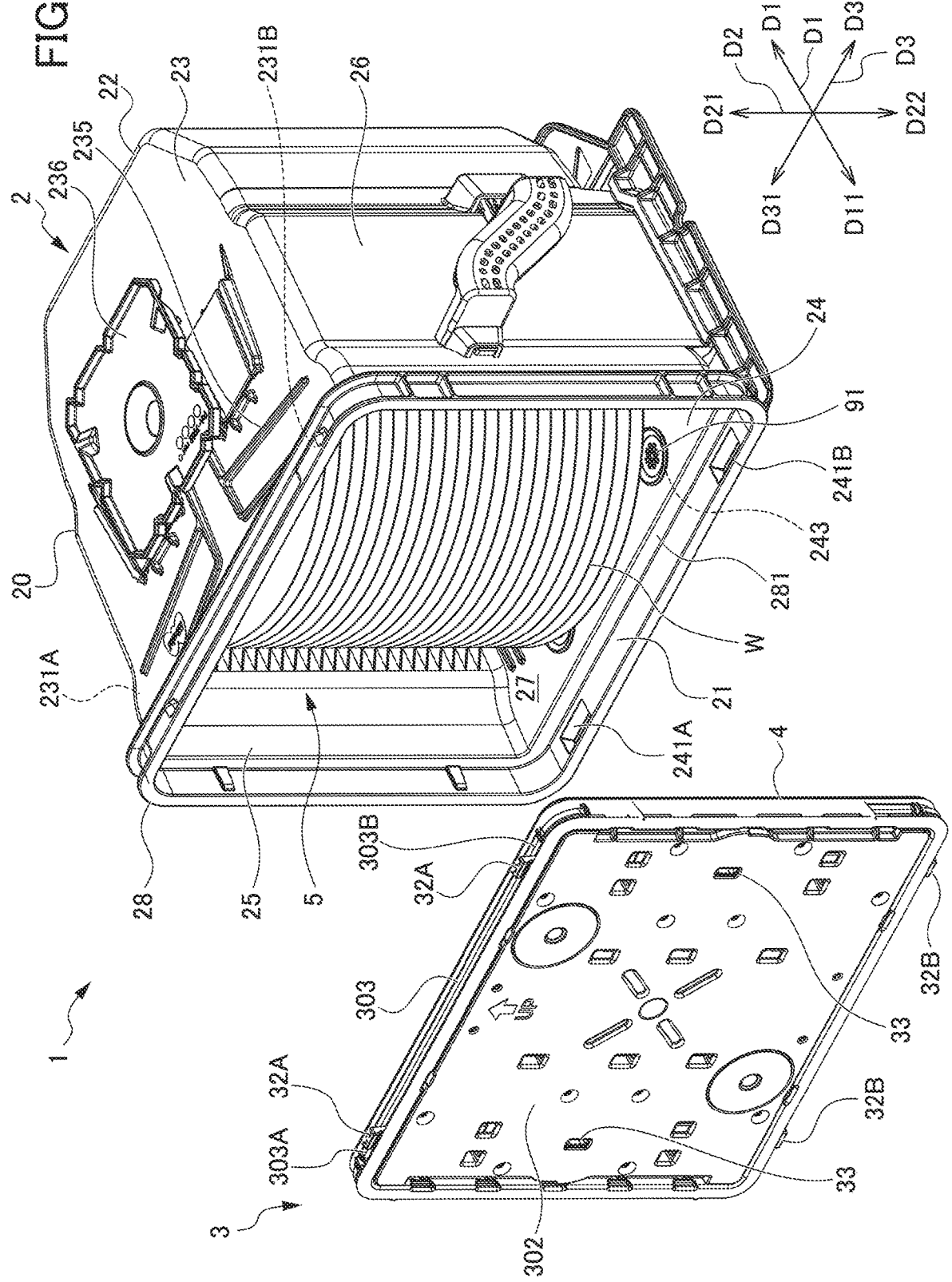
FIG. 1 is an exploded perspective view illustrating an aspect of a plurality of substrates W stored in a substrate storing container 1 according to a first embodiment of the present invention.
Figure 2:
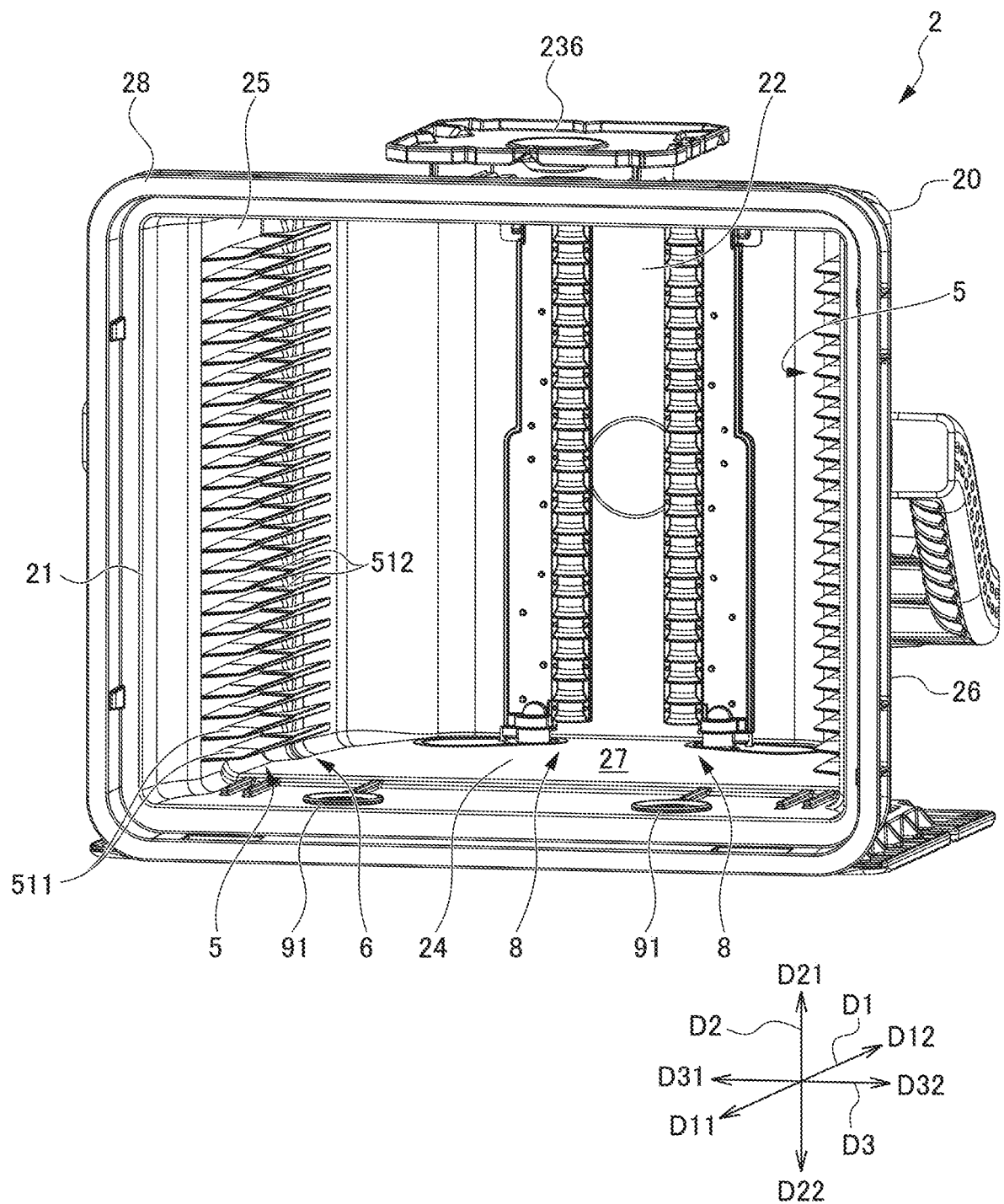
FIG. 2 is an upper perspective view illustrating a container main body 2 of the substrate storing container 1 according to the first embodiment of the present invention.
Figure 3:
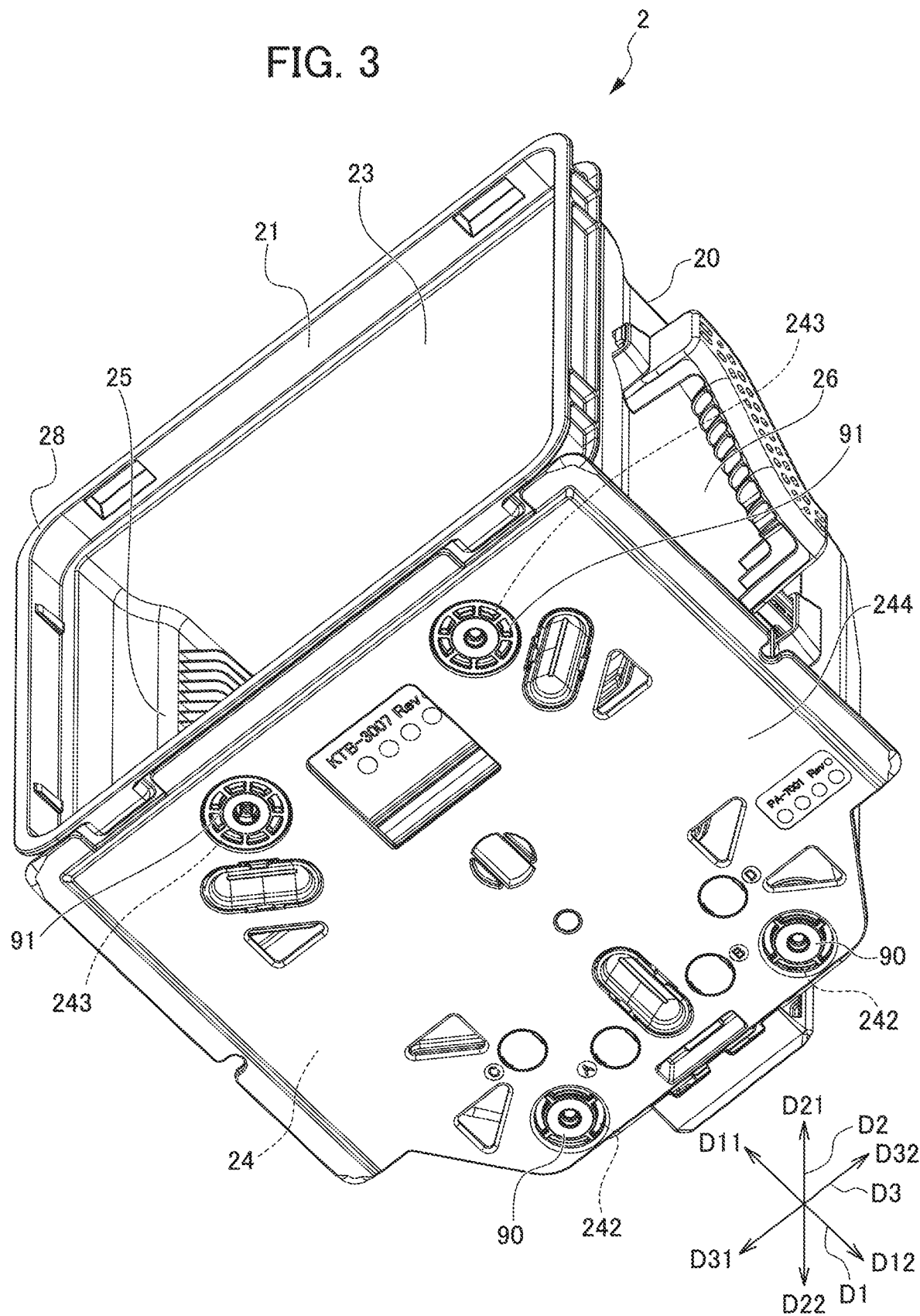
FIG. 3 is a lower perspective view illustrating the container main body 2 of the substrate storing container 1 according to the first embodiment of the present invention.
Figure 4:
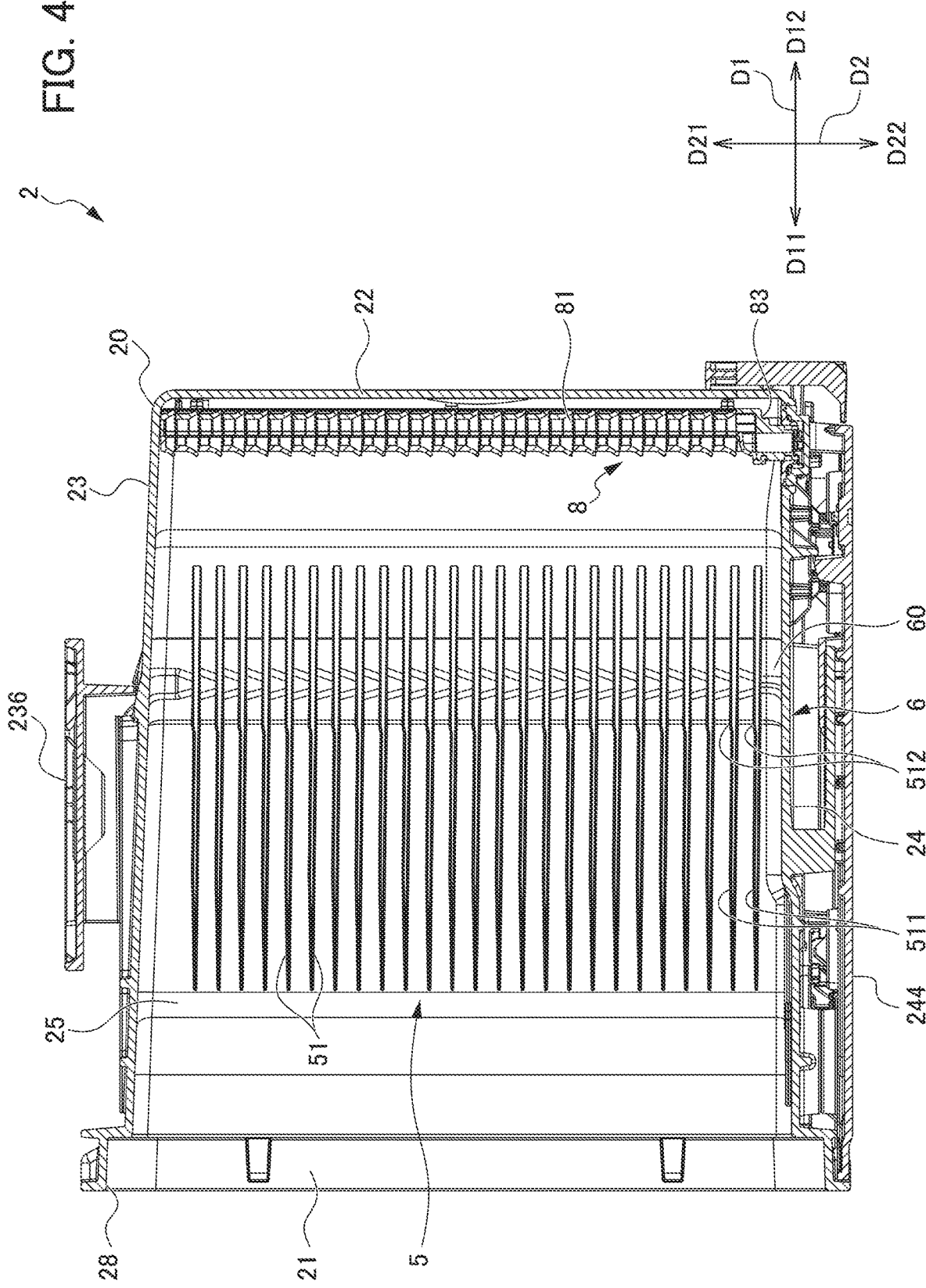
FIG. 4 is a lateral sectional view illustrating the container main body 2 of the substrate storing container 1 according to the first embodiment of the present invention.

In the following, a substrate storing container 1 according to the present embodiment is described with reference to the drawings. FIG. 1 is an exploded perspective view illustrating an aspect of a plurality of substrates N stored in the substrate storing container 1. FIG. 2 is an upper perspective view illustrating a container main body 2 of the substrate storing container 1. FIG. 3 is a lower perspective view illustrating the container main body 2 of the substrate storing container 1. FIG. 4 is a lateral sectional view illustrating the container main body 2 of the substrate storing container 1.

Herein, for convenience of description, the direction from the container main body 2 toward a lid body 3 (direction from the upper right toward the lower left in FIG. 1), which will be described later, is defined as a forward direction D11 and the direction opposite thereto is defined as a backward direction D12. Furthermore, these directions are defined as a forward/backward direction D1. In addition, the direction from a lower wall 24 toward an upper wall 23 (upper direction in FIG. 1), which will be described later, is defined as an upper direction D21 and the direction opposite thereto is defined as a lower direction D22. Furthermore, these directions are defined as an upper/lower direction D2. Moreover, the direction from a second side wall 26 toward a first side wall 25 (direction from the lower right to the upper left in FIG. 1), which will be described later, is defined as a left direction D31 and the direction opposite thereto is defined as a right direction D32. Furthermore, these directions are defined as a left/right direction D3. In the main drawings, arrows indicating these directions are illustrated.

Furthermore, the substrate W (see FIG. 1) stored in the substrate storing container 1 is a disk-like silicon wafer, glass wafer, sapphire wafer, or the like, and is a thin member used for industrial use. The substrate W in the present embodiment is a silicon wafer having a diameter of 300 mm.

As illustrated in FIG. 1, the substrate storing container 1 is used as a process container for storing the substrate W formed of the silicon wafer as described above and conveying the substrate W in a process in a factory, or as a shipment container for transporting substrates by transporting means such as land transporting means, air transporting means, or water transporting means, and is constituted icy the container main body 2 and the lid body 3. The container main body 2 includes substrate support plate-like portions 5 as a lateral substrate support portion and back side substrate support portions 6 (see FIG. 2 and the like), and the lid body 3 includes a front retainer 7 (see FIG. 12) as a lid body side substrate support portion.

The container main body 2 has a tubular wall portion 20 in which a container main body opening portion 21 is formed at one end portion and the other end portion is closed. A substrate storing space 27 is formed in the container main body 2. The substrate storing space 27 is formed to be surrounded by the wall portion 20. The substrate support plate-like portion 5 is disposed at a part which is a portion of the wall portion 20 and forms the substrate storing space 27. The plurality of substrates W can be stored in the substrate storing space 27 as illustrated in FIG. 1.

The substrate support plate-like portions 5 are provided at the wall portion 20 so as to form a pair in the substrate storing space 27. When the container main body opening portion 21 is not closed by the lid body 3, the substrate support plate-like portions 5 can support the edge portions of the plurality of substrates W in a state in which adjacent substrates W are arranged in parallel to be spaced apart by a predetermined interval by abutting the edge portions of the plurality of substrates W. The back side substrate support portions 6 are provided to be formed integrally with the substrate support plate-like portions 5 on the back side of the substrate support plate-like portions 5.

The back side substrate support portions 6 (see FIG. 2 and the like) are provided at the wall portion 20 so as to form a pair with the front retainer 7, which will be described later, in the substrate storing space 27. When the container main body opening portion 21 is closed by the lid body 3, the back side substrate support portions 6 can support rear portions of the edge portions of the plurality of substrates W by abutting the edge portions of the plurality of substrates W.

The lid body 3 can be removably attached to an opening circumferential portion 28 (FIG. 1 and the like) forming the container main body opening portion 21 and can close the container main body opening portion 21. The front retainer 7 is a part of the lid body 3 and is provided at a part which faces the substrate storing space 27 when the container main body opening portion 21 is closed by the lid body 3. The front retainer 7 is disposed so as to form a pair with the back side substrate support portion 6 inside the substrate storing space 27.

When the container main body opening portion 21 is closed by the lid body 3, the front retainer 7 can support front portions of the edge portions of the plurality of substrates W by abutting the edge portions of the plurality of substrates W. When the container main body opening portion 21 is closed by the lid body 3, the front retainer 7 retains the plurality of substrates W in a state in which adjacent substrates W are arranged in parallel to be spaced apart by a predetermined interval by supporting the plurality of substrates W in cooperation with the back side substrate support portions 6.

The substrate storing container 1 is made of a resin such as a plastic material, and unless otherwise described, examples of the resin of the material include thermoplastic resins such as polycarbonate, cycloolefin polymer, polyether imide, polyether ketone, polybutylene terephthalate, polyether ether ketone, and liquid crystal polymer, and alloys thereof. In the case of imparting conductivity, conductive substances such as carbon fibers, carbon powders, carbon nanotubes, and conductive polymers are selectively added to the resins of these forming materials. Furthermore, in order to increase rigidity, it is possible to add glass fibers, carbon fibers, and the like.

Figure 5:
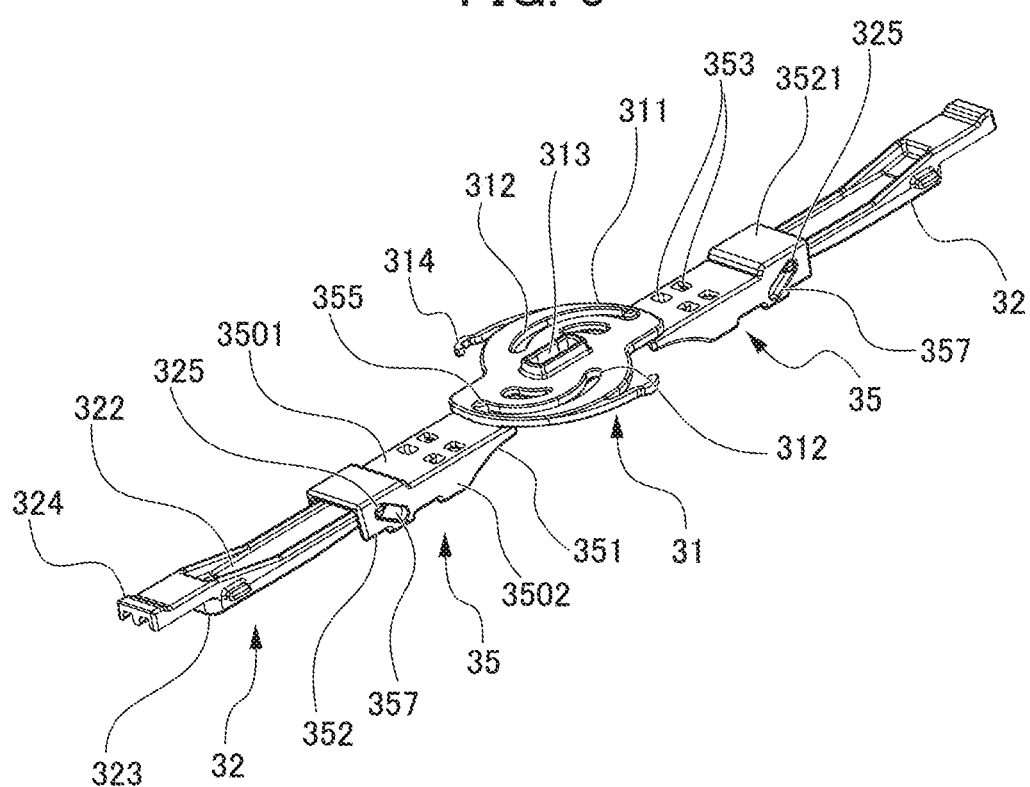
FIG. 5 is a perspective view illustrating a latch rotating member 31, latch arms 32, and latch lifting/lowering cam members 35 of a latch structure of a lid body 3 of the substrate storing container 1 according to the first embodiment of the present invention.
Figure 6:
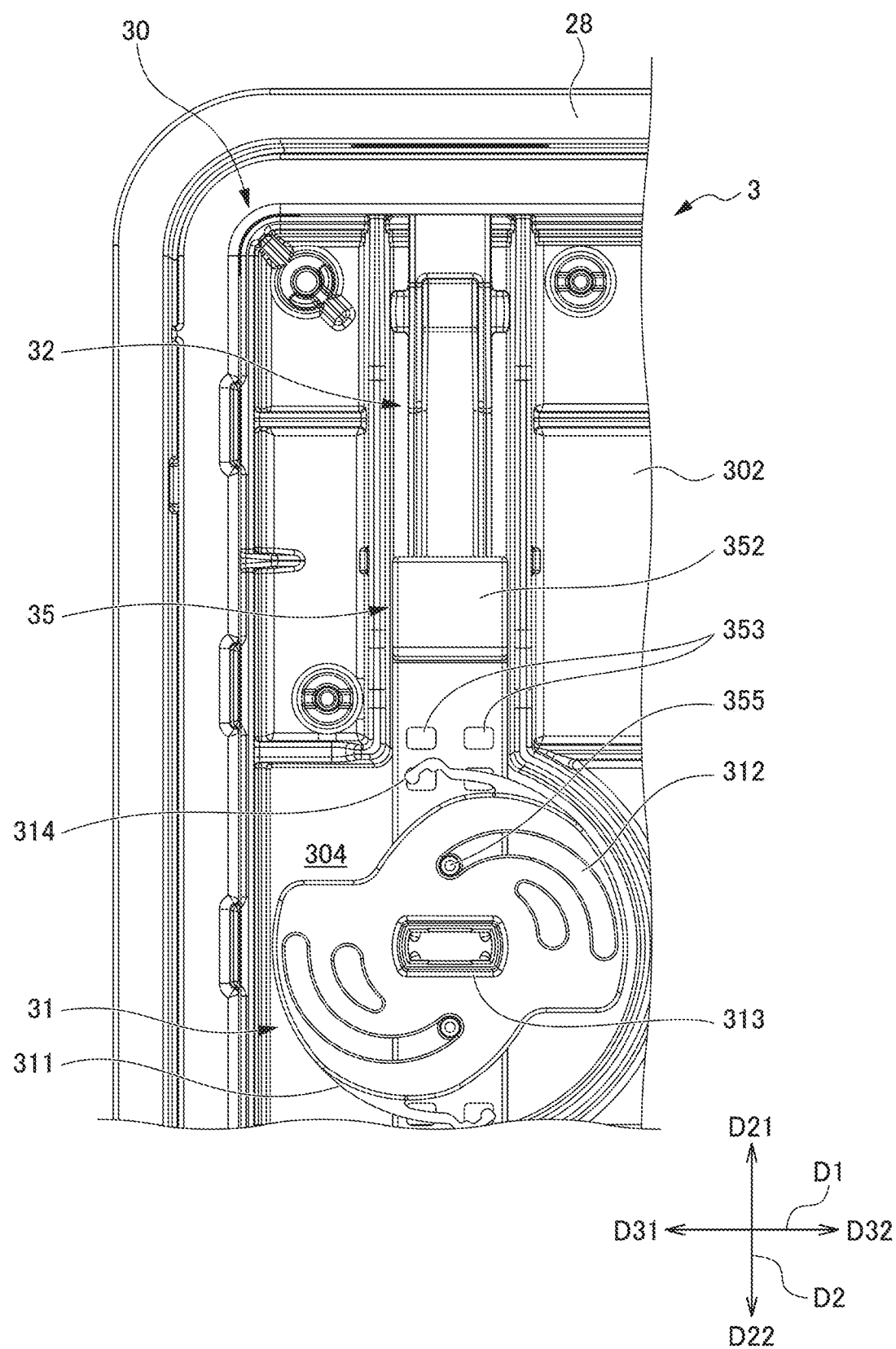
FIG. 6 is an enlarged front view illustrating an aspect of the latch rotating member 31 being rotated to a position where the latch arm 32 of the latch structure of the lid body 3 of the substrate storing container 1 according to the first embodiment of the present invention is in a disengagement position.
Figure 7:
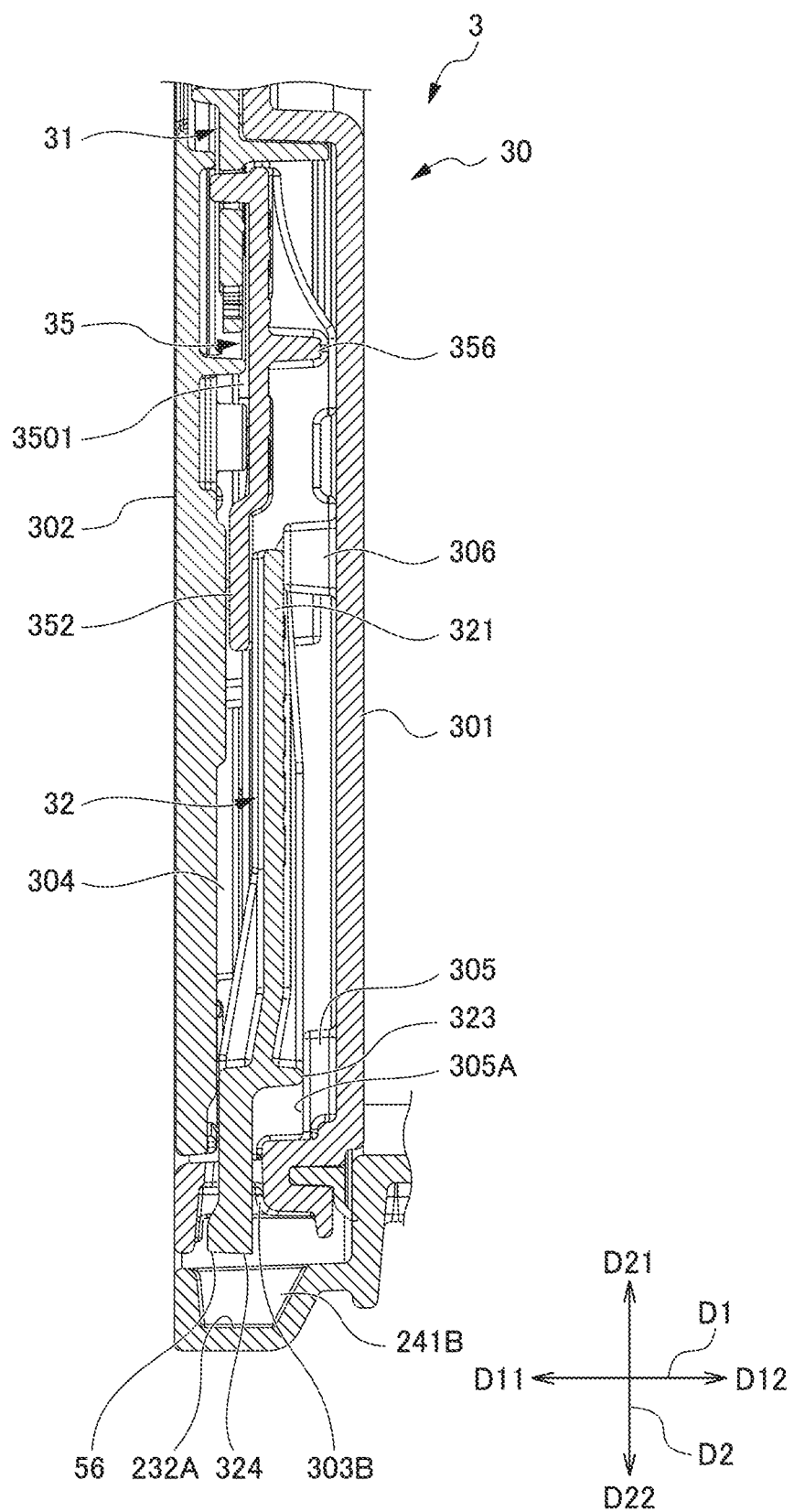
FIG. 7 is an enlarged sectional view illustrating an aspect of the latch arm 32 of the latch structure of the lid body 3 of the substrate storing container 1 according to the first embodiment of the present invention being in the disengagement position.
Figure 8:
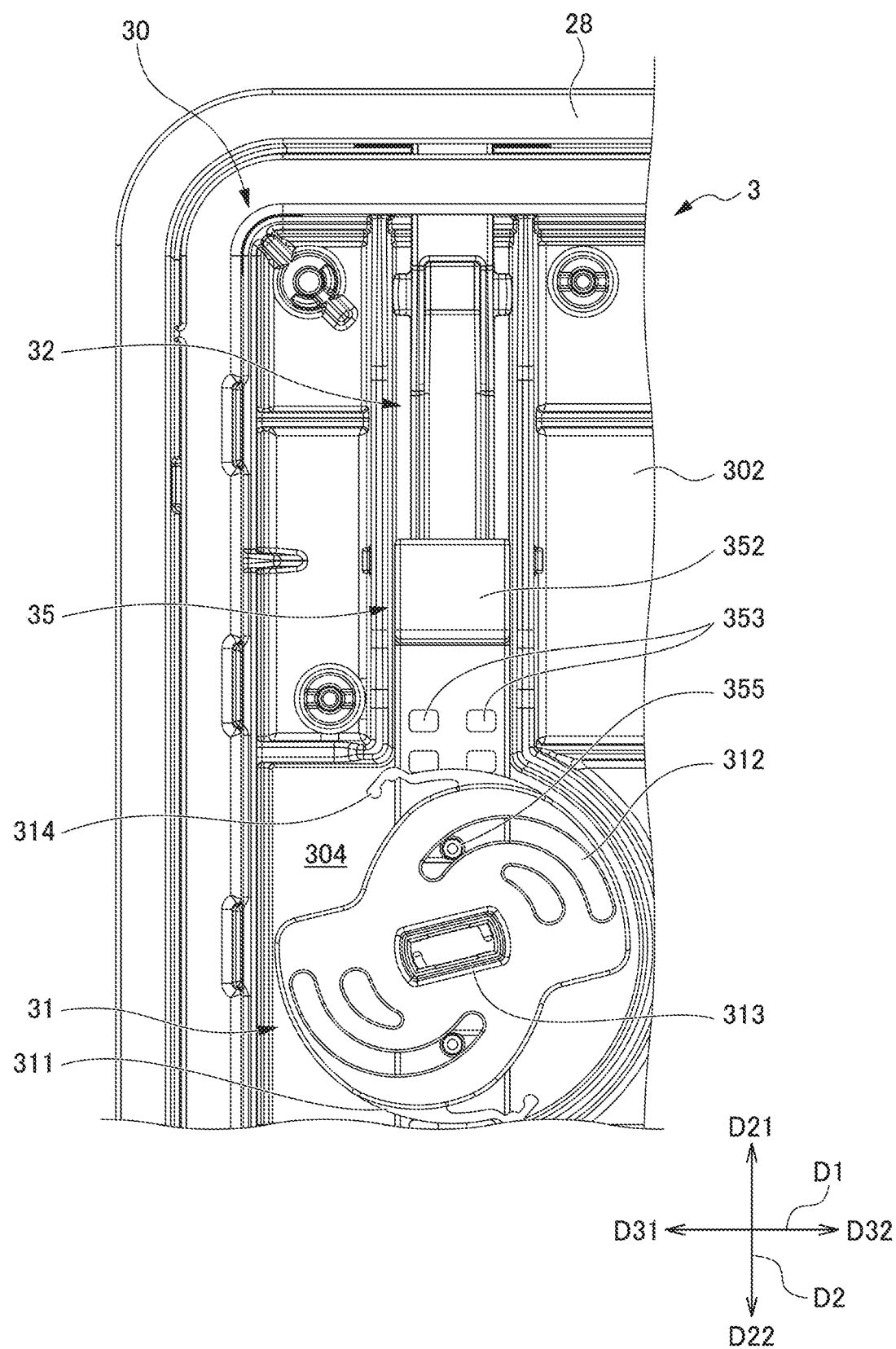
FIG. 8 is an enlarged front view illustrating an aspect of the latch rotating member 31 being rotated to a position where the latch arm 32 of the latch structure of the lid body 3 of the substrate storing container 1 according to the first embodiment of the present invention is in an insertion position.
Figure 9:
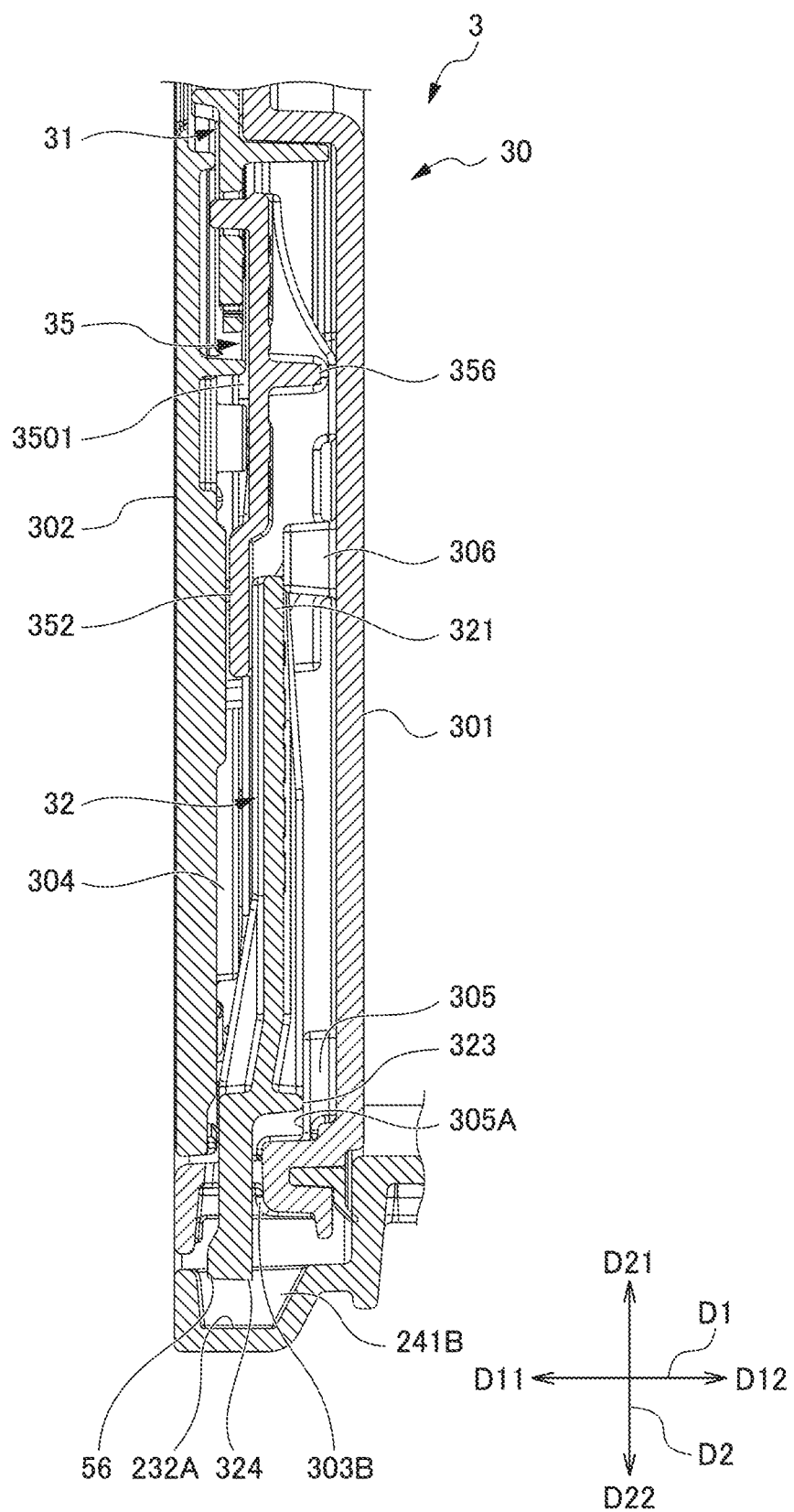
FIG. 9 is an enlarged sectional view illustrating, an aspect of the latch arm 32 of the latch structure of the lid body 3 of the substrate storing container 1 according to the first embodiment of the present invention being moved to the insertion position.
Figure 10:
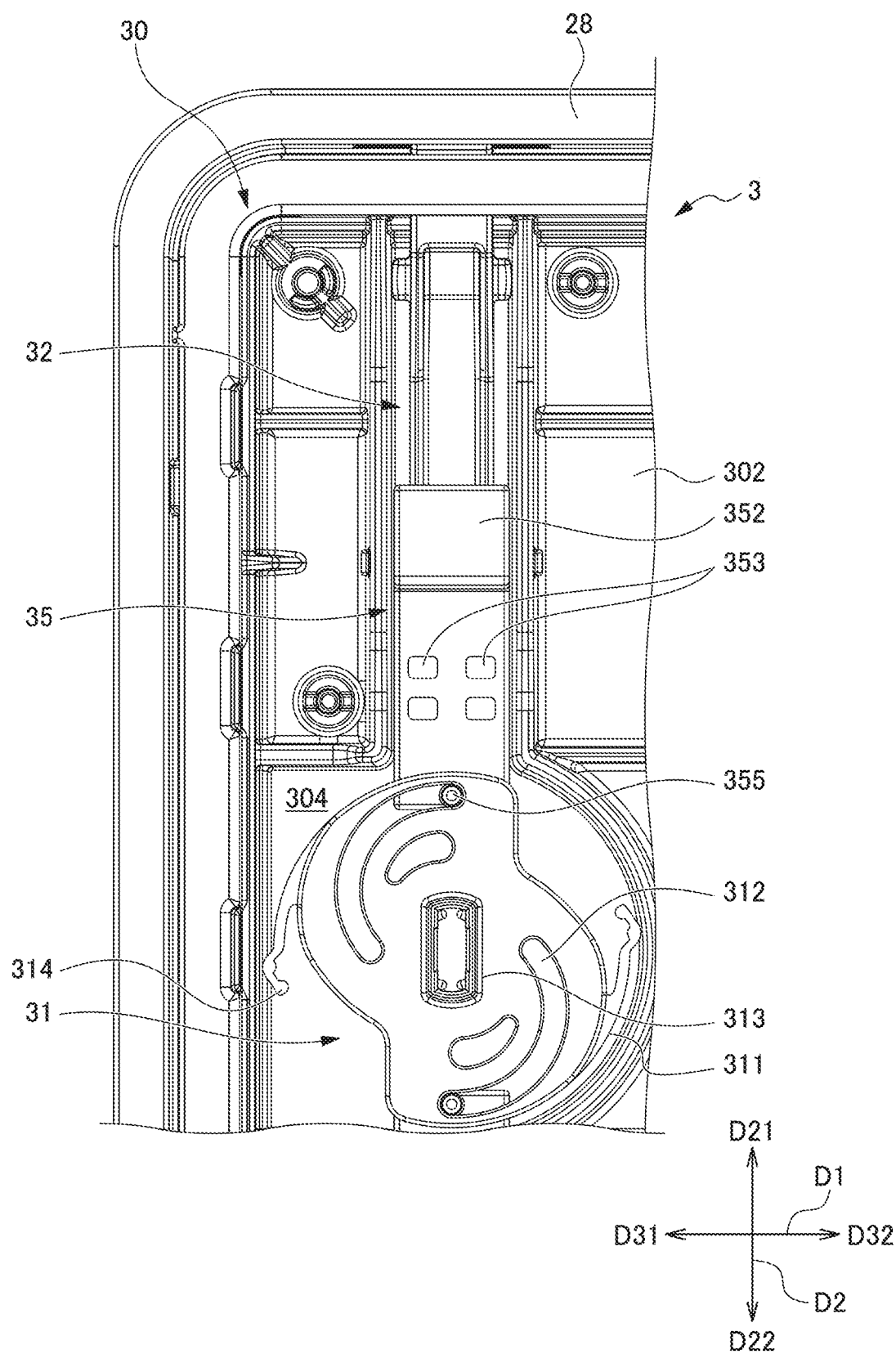
FIG. 10 is an enlarged front view illustrating an aspect of the latch rotating member 31 being rotated to a position where the latch arm 32 of the latch structure of the lid body 3 of the substrate storing container 1 according to the first embodiment of the present invention is in a push-in position.
Figure 11:
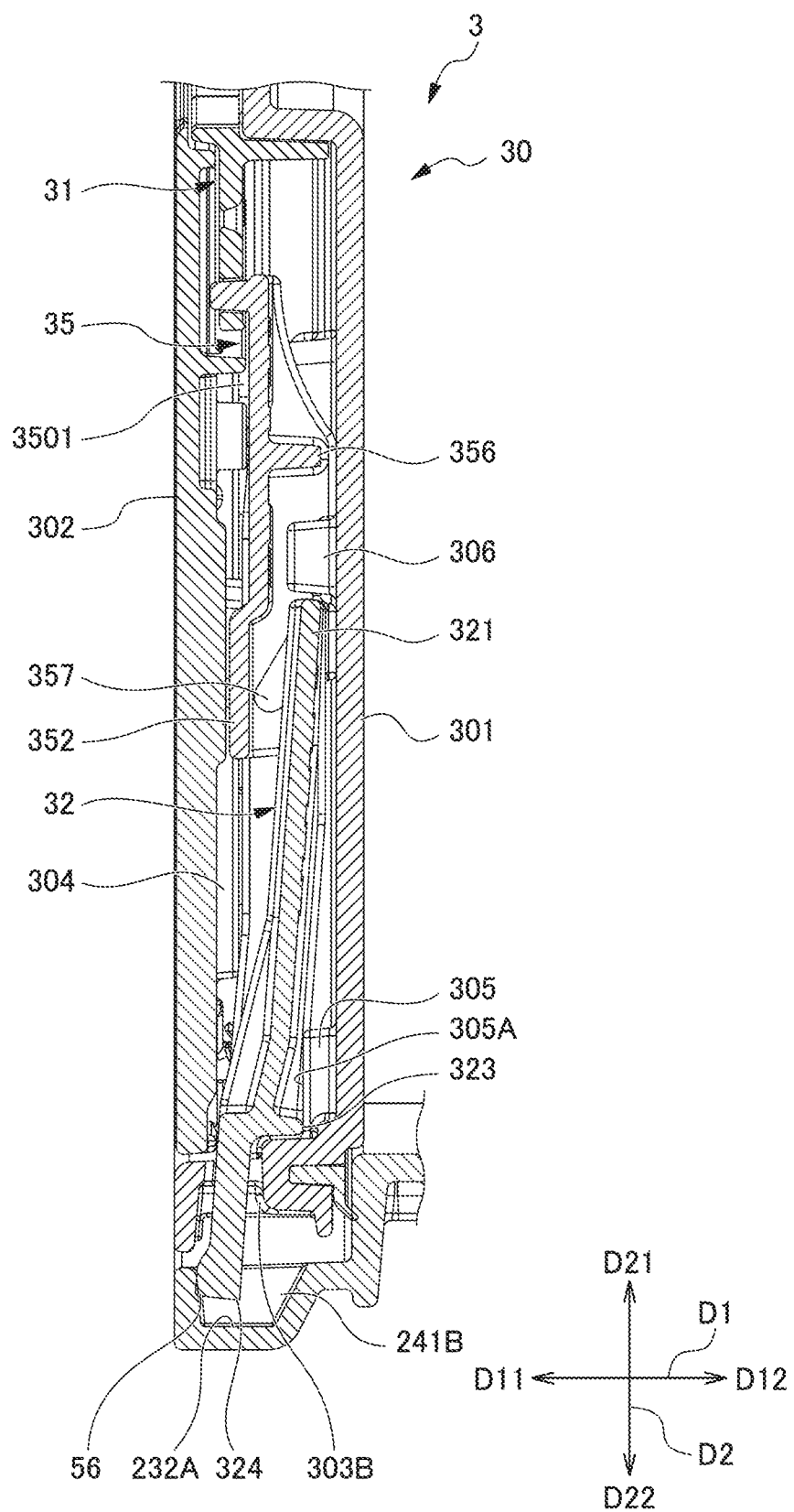
FIG. 11 is an enlarged sectional view illustrating an aspect of the latch arm 32 of the latch structure of the lid body 3 of the substrate storing container 1 according to the first embodiment of the present invention being moved to the push-in position.

Each portion is described in detail in the following. FIG. 5 is a perspective view illustrating a latch rotating member 31, latch arms 32, and latch lifting/lowering cam members 35 of a latch structure of the lid body 3 of the substrate storing container 1 according to a first embodiment of the present invention. FIG. 6 is an enlarged front view illustrating an aspect of the latch rotating member 31 being rotated to a position where the latch arm 32 of the latch structure of the lid body 3 of the substrate storing container 1 according to the first embodiment of the present invention is in a disengagement position. FIG. 7 is an enlarged sectional view illustrating an aspect of the latch arm 32 of the latch structure of the lid body 3 of the substrate storing container 1 according to the first embodiment of the present invention being in the disengagement position. FIG. 8 is an enlarged front view illustrating an aspect of the latch rotating member 31 being rotated to a position where the latch arm 32 of the latch structure of the lid body 3 of the substrate storing container 1 according to the first embodiment of the present invention is in an insertion position. FIG. 9 is an enlarged sectional view illustrating an aspect of the latch arm 32 of the latch structure of the lid body 3 of the substrate storing container 1 according to the first embodiment of the present invention being moved to the insertion position. FIG. 10 is an enlarged front view illustrating an aspect of the latch rotating member 31 being rotated to a position where the latch arm 32 of the latch structure of the lid body 3 of the substrate storing container 1 according to the first embodiment of the present invention is in a push-in position. FIG. 11 is an enlarged sectional view illustrating an aspect of the latch arm 32 of the latch structure of the lid body 3 of the substrate storing container 1 according to the first embodiment of the present invention being moved to the push-in position.

As illustrated in FIG. 1, the wall portion 20 of the container main body 2 includes a back wall 22, the upper wall 23, the lower wall 24, the first side wall 25, and the second side wall 26. The back wall 22, the upper wall 23, the lower wall 24, the first side wall 25, and the second side wall 26 are made of the above-mentioned material, and are configured so as to be integrally molded.

The first side wall 25 faces the second side wall 26, and the upper wall 23 faces the lower wall 24. A rear end of the upper wall 23, a rear end of the lower wall 24, a rear end of the first side wall 25, and a rear end of the second side wall 26 are all connected to the back wall 22. A front end of the upper wall 23, a front end of the lower wall 24, a front end of the first side wall 25, and a front end of the second side wall 26 configure the opening circumferential portion 28 which forms the container main body opening portion 21 in a substantially rectangular shape.

The opening circumferential portion 28 is provided at one end portion of the container main body 2, and the back wall 22 is located at the other end portion of the container main body 2. The external shape of the container main body 2 formed by the outer faces of the wall portion 20 is a box shape. Inner faces of the wall portion 20, that is, an inner face of the back wall 22, an inner face of the upper wall 23, an inner face of the lower wall 24, an inner face of the first side wall 25, and an inner face of the second side wall 26, form the substrate storing space 27, which is surrounded thereby. The container main body opening portion 21 formed by the opening circumferential portion 28 is surrounded by the wall portion 20 and is in communication with the substrate storing space 27 formed inside the container main body 2. The substrate storing space 27 can store a maximum of twenty-five substrates W.

As illustrated in FIG. 1, latch engagement concave portions 231A, 231B, 241A, and 241B, which are concave outwardly from the substrate storing space 27, are formed at parts of the upper wall 23 and the lower wall 24 which are proximal to the opening circumferential portion 28. The latch engagement concave portions 231A, 231B, 241A, and 241B are respectively formed in the vicinities of both right and left end portions of the upper wall 23 and the lower wall 24. The total amount thereof is four.

As illustrated in FIG. 1, ribs 235 are provided so as to be integrally formed with the upper wall 23 at an outer face of the upper wall 23. The ribs 235 increase the rigidity of the container main body 2. In addition, a top flange 236 is fixed at the center portion of the upper wall 23. The top flange 236 is a member which becomes a part of the substrate storing container 1 from which it is hung to be suspended when suspending the substrate storing container 1 by AMHS (Automated Material Handling System), PGV (Person Guided Vehicle), or the like.

As illustrated in FIG. 3, a bottom plate 244 is fixed to the lower wall 24. The bottom plate 244 has a substantially rectangular plate shape to be disposed to face the entire area of a lower face forming an outer face of the lower wall 24, and is fixed to the lower wall 24.

As illustrated in FIG. 3, at four corners of the lower wall 24, supply holes 242 and exhaust holes 243, which are two types of through-holes, are formed. In the present embodiment, the through-holes at two points of the front portion of the lower wall 24 are the exhaust holes 243 through which gas inside the container main body 2 is discharged, and the through-holes at two points of the rear portion thereof are the supply holes 242 through which gas is supplied into the container main body 2.

A supply filter portion 90 as an additional component is disposed in the through-hole as the supply hole 242, and an exhaust filter portion 91 is disposed in the through-hole as the exhaust hole 243. That is, passages for the gas inside the supply filter portion 90 and the exhaust filter portion 91 configure a portion of a ventilation passage which enables the substrate storing space 27 and the space outside the container main body 2 to communicate with each other. In addition, the supply filter portion 90 and the exhaust filter portion 91 are disposed in the wall portion 20, and through the supply filter portion 90 and the exhaust filter portion 91, the gas can pass between the space outside the container main body 2 and the substrate storing space 27. The supply filter portion 90 communicates with an internal space of a gas ejecting nozzle portion 8 and is configured to supply a purge gas supplied to the supply filter portion 90 to the substrate storing space 27 through the internal space of the gas ejecting nozzle portion 8.

As illustrated in FIG. 2 and the like, the substrate support plate-like portions 5 are provided at the first side wall 25 and the second side wall 26, respectively, and are provided in the container main body 2 inside the substrate storing space 27 so as to form a pair in the left/right direction D3. Specifically, as illustrated in FIG. 4 and the like, the substrate support plate-like portions 5 include plate portions 51.

The plate portion 51 has a plate-like substantially arc shape. Twenty-five of the plate portions 51 are provided at each of the first side wall 25 and the second side wall 26 in the upper/lower direction D2. The total number of the plate portions 51 is fifty. The adjacent plate portions 51 are disposed so as to be spaced apart in the upper/lower direction D2 by an interval of 10 mm to 12 mm in a parallel positional relationship.

Furthermore, the twenty-five plate portions 51 provided at the first side wall 25 and the twenty-five plate portions 51 provided at the second side wall 26 have a positional relationship opposite to each other in the left/right direction D3. Convex portions 511 and 512 are provided at an upper face of the plate portion 51. The substrate W supported by the plate portion 51 is only in contact with a projecting end of the convex portions 511 and 512, and does not contact with the face of the plate portion 51.

With the substrate support plate-like portions 5 of such a configuration, it is possible to support the edge portions of the plurality of substrates W in a state in which the adjacent substrates W among the plurality of substrates W are arranged to be spaced apart by a predetermined interval in a parallel positional relationship.

As illustrated in FIG. 4, the back side substrate support portion 6 has back side end edge support portions 60. The back side end edge support portions 60 are integrally formed with the container main body 2 at rear end portions of the plate portions 51 of the substrate support plate-like portions 5.

The back side end edge support portions 60 are provided in a number, specifically, twenty-five, so as to respectively correspond to the substrates W that can be stored in the substrate storing space 27. The back side end edge support portions 60 disposed at the first side wall 25 and the second side wall 26 have a positional relationship that forms a pair with the front retainer 7, which will be described later, in the forward/backward direction D1. As the substrates W are stored in the substrate storing space 27 and the lid body 3 is closed, the back side end edge support portions 60 sandwich and support the end edges of the edge portions of the substrates W.

As illustrated in FIG. 1, the lid body 3 has a substantially rectangular shape which substantially matches the shape of the opening circumferential portion 28 of the container main body 2. The lid body 3 is removably attached to the opening circumferential portion 28 of the container main body 2. By the lid body 3 being attached to the opening circumferential portion 28, the lid body 3 can close the container main body opening portion 21 in a positional relationship surrounded by the opening circumferential portion 28. As illustrated in FIG. 8 and the like, the lid body 3 includes a lid body main body 30.

As illustrated in FIG. 1, FIG. 7, and the like, the lid body main body 30 includes an inner plate-like portion 301 having a substantially rectangular plate shape, an outer plate-like portion 302 having a substantially rectangular plate shape, a circumferential wall portion 303. A face of the inner plate-like portion 301 on a side in the backward direction D12 configures a lid body inner face, and forms the substrate storing space 27 together with the inner face of the container main body when the container main body opening portion 21 is closed by the lid body 3. A circumferential portion of the inner plate-like portion 301 is provided with the circumferential wall portion 303 extending in the forward direction D11, which is a direction orthogonal to the lid body inner face of the inner plate-like portion 301, along the circumferential portion so as to go around the circumferential portion. The inner plate-like portion 301 and the circumferential wall portion 303 are integrally molded and connected by, for example, polycarbonate. The inner plate-like portion 301 and the circumferential wall portion 303 are not limited to being formed of polycarbonate.

As illustrated in FIG. 1 and the like, the outer plate-like portion 302 is disposed at an extension end portion of the circumferential wall portion 303 in the forward direction D11. The outer plate-like portion 302 is fixed to the inner plate-like portion 301 in a state in which the circumference of the outer plate-like portion 302 is surrounded by the circumferential wall portion 303. With this configuration, the inner plate-like portion 301, the circumferential wall portion 303, and the outer plate-like portion 302 constitute a box-like structure, and a lid body internal space 304 (see FIG. 7) surrounded by the inner plate-like portion 301, the circumferential wall portion 303, and the outer plate-like portion 302 is formed. In addition, a face of the outer plate-like portion 302 on a side in the forward direction D11 configures a lid body outer face. Therefore, the lid body 3 has a substantially rectangular plate shape (thin rectangular parallelepiped shape) with the lid body outer face and the lid body inner face as a whole, which substantially matches the shape of the opening circumferential portion 28 of the container main body 2. The lid body 3 can be removably attached to the opening circumferential portion 28 of the container main body 2. By the lid body 3 being attached to the opening circumferential portion 28, the lid body 3 can close the container main body opening portion 21.

An annular sealing member 4 is attached to, in the inner face of the lid body 3 (a face on the rear side of the lid body 3 illustrated in FIG. 1), a face facing a face of a stepped part (sealing face 281) formed at a position immediately behind the opening circumferential portion 28 in the backward direction D12 when the lid body 3 closes the container main body opening portion 21, that is, the circumference of the inner plate-like portion 301 configuring the lid body main body 30, so as to go around the outer circumferential portion of the lid body 3. The sealing member 4 is disposed so as to go around the circumferential wall portion 303 of the lid body main body 30. The sealing member 4 is made of various thermoplastic elastomers such as elastically deformable polyesters and polyolefins, fluororubber, silicone rubber, and the like.

When the lid body 3 is attached to the opening circumferential portion 28, the sealing member 4 is elastically deformed by being sandwiched between the sealing face 281 (see FIG. 1) of the container main body 2 and the inner face of the lid body main body 30. That is, by the sealing member 4 being interposed between the lid body 3 and the container main body 2, the lid body 3 can close the container main body opening portion 21 in a state in which the lid body main body 30 and the opening circumferential portion 28 are not separated from each other without abutting each other. As the lid body 3 is detached from the opening circumferential portion 28, the substrates W can be taken in and out from the substrate storing space 27 in the container main body 2.

As illustrated in FIG. 7 and the like, in the lid body internal space 304 of the lid body main body 30, a latching mechanism is provided which includes the latch rotating member 31 as a latch driving portion, the latch arms 32 as engagement latches, and the latch lifting/lowering cam members 35 as engagement latch lifting/lowering cams which connect the latch rotating member 31 as a rotating cam to the latch arms 32. The latching mechanisms are respectively disposed at a position closer to the left direction D31 and a position closer to the right direction D32 in the lid body internal space 304. A total of two pairs of latch arms 32 are disposed to form a pair in the upper/lower direction D2. As illustrated in FIG. 5, base end portions 321 (see FIG. 7) of the pair of latch arms 32 are respectively engaged with tip end portions 352 of the latch lifting/lowering cam members 35. Base portions. 351 of the latch lifting/lowering cam members 35 are respectively engaged with the latch rotating members 31 as the latch driving portions. The latch lifting/lowering cam members 35 and the latch arms 32 extend in both the upper direction D21 and the lower direction D22 from the base end portions of the latch lifting/lowering cam members 35 engaged with the latch rotating member 31.

More specifically, the latch rotating member 31 is integrally molded with a POM (polyacetal) resin as a main component. Therefore, the latch rotating member 31 is formed of a rigid body that is not substantially elastically deformed by a reaction force or the like exerted from the latch lifting/lowering cam member 35 and the latch arm 32 when the latch arm 32 is moved between the disengagement position, the insertion position, and the push-in position as will be described later. The latch rotating member 31 is not limited to being formed of a POM (polyacetal) resin as the main component. The latch rotating member 31 has a circular portion. 311 and is supported by the inner plate-like portion 301 (see FIG. 8 and the like) of the lid body main body 30 so as to be rotatable around the center of the circular portion 311 as the rotation axis. The latch rotating member 31 is rotatable as described, but is supported by the inner plate-like portion 301 so as to be immovable in the upper/lower direction D2 and the left/right direction D3. At positions near the circumference of the circular portion 311, a pair of elongated holes 312 having an arc shape of approximately 90° at the center angle of the circular portion 311 is formed along substantially the circumference in a point symmetric positional relationship.

As illustrated in FIG. 5 and the like, in the elongated hole 312, the straight-line distance from the center of the circular portion 311 to the elongated hole 312 varies depending on the point of the elongated hole 312. For example, the straight-line distance from the center of the circular portion 311 illustrated in FIG. 6 to an end portion in a clockwise direction of the elongated hole 312 takes a maximum value. In addition, the straight-line distance from the center of the circular portion 311 to an end portion in a counterclockwise direction of the elongated hole 312 takes a minimum value.

At a central portion of the latch rotating member 31, a straight convex portion 313 linearly projecting is formed. The straight convex portion 313 has a surrounding wall portion projecting from the circular portion 311, and in a space surrounded by the wall portion, a straight convex portion provided at a tip end of an arm of a device (not illustrated) for opening and closing the lid body 3 can be fitted. As the arm (not illustrated) is rotated in a state in which the straight convex portion (not illustrated) is fitted in the space of the straight convex portion 313, the latch rotating member 31 can be rotated. By the latch rotating member 31 being rotated, as will be described later, the latch rotating member 31 can move the latch arm 32 between an engagement position and the disengagement position due to the difference in the straight-line distance from the center of the circular portion 311 to the elongated hole 312.

In addition, elastic projecting portions 314 are provided at the circumferential portion of the latch rotating member 31. The elastic projecting portion 314 is formed by a member which is formed to partially cover a cutout formed in the circumferential portion of the latch rotating member 31 and extends in a circumferential direction of the latch rotating member 31, and a portion of the member protrudes from the latch rotating member 31 in a radially outward direction. The elastic projecting portion 314 can be engaged with an engagement portion (not illustrated) formed in the outer plate-like portion 302 in a case where a cylindrical convex portion 355 is located at the end portion in the clockwise direction or the counterclockwise direction of the elongated hole 312 illustrated in FIG. 6, and due to this engagement, the latch rotating member 31 is brought into a state in which the latch rotating member 31 is temporarily hardly rotated. When the latch arm 32 is in the push-in position, which will be described later, or in a position of the disengagement position other than the position where the cylindrical convex portion 355 is located at the end portion in the counterclockwise direction of the elongated hole 312, the elastic projecting portion 314 is not particularly engaged with a portion of the outer plate-like portion 302, and the latch rotating member 31 is brought into a state in which the latch rotating member 31 can easily rotate.

The two pairs of latch arms 32 can move with respect to the lid body main body 30 between the disengagement position, at which engagement with the latch engagement concave portions 231A, 231B, 241A, and 241B is released and fixing of the lid body main body 30 to the container main body 2 is released, and the engagement position. The engagement position is constituted by the insertion position and the push-in position. In the engagement position, when the container main body opening portion 21 is closed by the lid body 3, the two pairs of latch arms 32 can move with respect to the lid body main body 30 between the insertion position where the two pairs of latch arms 32 are respectively inserted into the two pairs of latch engagement concave portions 231A, 231B, 241A, and 241B which form pairs in the upper/lower direction D2, and the push-in position where tip fitting portions 324 in the latch engagement concave portions 231A, 231B, 2411, and 241B move in the forward direction D11 from the state in the insertion position and push parts of the opening circumferential portion 28 forming the latch engagement concave portions 2311, 231B, 241A, and 241B in the forward direction D11 so as to cause the lid body 3 to be relatively pushed in the backward direction D12, which is a direction toward the container main body 2.

Specifically, the pair of latch arms 32 has symmetrical shapes with respect to a plane that passes through the rotation axis of the latch rotating member 31 and is parallel to the left/right direction D3 and the forward/backward direction D1. Therefore, only one latch arm 32 will be described, and description of the other latch arm 32 will be omitted in a case where there is no particular need.

The latch arm 32 is integrally molded with a POM (polyacetal) resin as a main component, and has a substantially rectangular shape in a front view as illustrated in FIG. 7. As illustrated in FIG. 5 and the like, the latch arm 32 has connecting shafts 325, a fulcrum portion 323, and a tip fitting portion 324. The latch arm 32 is not limited to being formed of a POM (polyacetal) resin as the main component.

When the latch arm 32 is in the disengagement position, which will be described later, the base portion of the latch arm 32 is supported by a base portion support portion 306 (see. FIG. 7 and the like) projecting from the inner plate-like portion 301 in the forward direction D11. When the latch arm 32 moves from the insertion position to the push-in position, which will be described later, as illustrated in FIG. 11 and the like, the base portion of the latch arm 32 is not supported by the base portion support portion 306 as will be described later. Therefore, the base portion of the latch arm 32 is supported as the connecting shafts 325 penetrating elongated holes 357 are supported by the latch lifting/lowering cam member 35.

The connecting shaft 325 is a member for connecting the latch lifting/lowering cam member 35 to the latch arm 32 by being fitted into the elongated hole 357 of the latch lifting/lowering cam member 35, which will be described later. The connecting shaft 325 is formed in a round bar shape and is provided at the base end portion of the latch arm 32 to be directed in the left/right direction D3.

The fulcrum portion 323 is a part which supports the tip end portion of the latch arm 32 and becomes a rotation center. The fulcrum portion 323 is a part serving as a fulcrum in the principle of leverage. The fulcrum portion 323 projects in the backward direction D12 in the vicinity of the tip of the latch arm 32. A projecting end portion of the fulcrum portion 323 is a part which comes in sliding contact with a flat surface 305A of a tip side cam 305 (see FIG. 7 and the like) to vertically move the tip fitting portion 324 of the latch arm 32. After the latch arm 32 is sent in a state in which the fulcrum portion 323 is in sliding contact with the flat surface 305A of the tip side cam 305, the base portion of the latch arm 32 provided with the connecting shafts 325 are pushed in the backward direction D12 as will be described later, so that the tip fitting portion 324 of the latch arm 32 is pushed in the forward direction D11. On the other hand, as the base portion of the latch arm 32 is pushed in the forward direction D11, the tip end portion of the latch arm 32 is returned in the backward direction D12.

The tip fitting portions 324 as latch members extend to the outside from through-holes 303A and 303B of the lid body internal space 304 and are directly fitted into the latch engagement concave portions 231A, 231B, 241A, and 241B of the opening circumferential portion 28. The tip fitting portion 324 configures the point of action of the principle of leverage. The tip fitting portions 324 are provided at a small distance from the fulcrum portions 323 so as to exhibit a sufficient force in a state of being fitted into the latch engagement concave portions 231A, 231B, 241A, and 241B of the opening circumferential portion 28.

As illustrated in FIG. 5 and the like, the tip fitting portion 324 configuring the end edge of a tip end portion 322 of the latch arm 32 has a straight-line shape extending in the left/right direction D3. The latch arms 32 have a length in a longitudinal direction (upper/lower direction D2) such that when the cylindrical convex portion 355 is located at the end portion of the elongated hole 312 in the clockwise direction as illustrated in FIG. 10, that is, when the latch arms 32 are in the insertion position and the push-in position, the tip end portions 322 of the pair of latch arms 32 are inserted into the latch engagement concave portions 231A, 231B, 241A, and 241B and do not abut parts of engagement concave portion forming portions (hereinafter, bottom portion forming portions 232A) forming bottom portions 240A and the like of the latch engagement concave portions 231A, 231B, 241A, and 241B. When the latch arms 32 are in the insertion position, as illustrated in FIG. 11, the tip end portions 322 of the latch arms 32 do not abut the parts of the opening circumferential portion 28 of the container main body 2 forming the latch engagement concave portions 231A, 231B, 241A, and 241B.

The latch lifting/lowering cam members 35 cause the latch arms 32 to advance to and retreat from the engagement concave portions 231A, 231B, 241A, and 241B and cause the latch arms 32 in the engagement concave portions 231A, 231B, 241A, and 241B to move in a direction toward/away from the back wall 22 as the other end portion of the container main body 2 by advancing and retreating in a direction in which the latch arms 32 advance and retreat.

Specifically, as illustrated in FIG. 5, the latch lifting/lowering cam member 35 is configured so that a front plate portion 3501 and a pair of side plate portions 3502 are integrally molded with a PST (polybutylene terephthalate) resin as a main component. Four rectangular through-holes 353 are formed in a central portion of the front plate portion 3501 in an arrangement of two rows and two columns. Between the two through-holes 353 closer to the base portion 351 and the two through-holes 353 closer to the tip end portion 352, a support convex portion 356 projecting from a face on the rear side of the front plate portion 3501 in the backward direction D12 is provided as illustrated in FIG. 7 and the like. A projecting end portion of the support convex portion 356 abuts the inner plate-like portion 301 and slides thereon so as to support the front plate portion 3501 and the like of the latch lifting/lowering cam member 35 when the latch lifting/lowering cam member 35 moves. The front plate portion 3501 and the pair of side plate portions 3502 are not limited to being formed of a PET (polybutylene terephthalate) resin as the main component.

The tip end portion 352 of the front plate portion 3501 has a forward projecting plate portion 3521 at a position projecting one step in the forward direction D11 as illustrated in FIG. 5. In the base portion 351 of the front plate portion 3501, as illustrated in FIG. 5 and the like, the cylindrical convex portion 355 extending in the forward direction D11 is provided. The cylindrical convex portions 355 are engaged with the pair of elongated holes 312 of the latch rotating member 31 one by one and can move in the elongated holes 312 relative to the elongated holes 312.

When the cylindrical convex portion 355 is located at the end portion in the counterclockwise direction of the elongated hole 312 in FIG. 6, the catch arm 32 is in the disengagement position. At this time, the tip end portions 322 of the latch arms 32 are brought into a state of not projecting from the through-holes 303A and 303B (see FIG. 1 and the like) formed in the circumferential wall portion 303 configuring the upper side and the lower side of the lid body 3 in the upper direction D21 and the lower direction D22, respectively. As illustrated in FIG. 5, when the cylindrical convex portion 355 is located at the end portion in the clockwise direction of the elongated hole 312, the latch arm 32 is in the push-in position. At this time, the tip end portions 322 of the latch arms 32 project from the through-holes 303A and 303B formed in the circumferential wall portion 303 of the lid body 3 in the upper direction D21 and the lower direction D22.

As illustrated in FIG. 5 and the like, the elongated holes 357 are formed in parts of the side plate portions 3052 in the tip end portion 352. The elongated hole 357 is formed to extend obliquely and linearly in the forward direction D11 from the base portion 351 toward the tip end portion 352 (in a direction away from the latch rotating member 31) in the latch lifting/lowering cam member 35. The connecting shaft 325 of the latch arm 32 penetrates the elongated hole 357, and the connecting shaft 325 can move in the elongated hole 357 in the extension direction of the elongated hole 357. A part of the latch lifting/lowering cam member 35 in which the elongated hole 357 is formed configures an engagement latch connection portion.

In a part of the inner plate-like portion 301 configuring the lid body inner face of the lid body 3, a concave portion 341 (see FIG. 12) which is concave outwardly (forward direction D11) from the substrate storing space 27 is formed. The front retainer 7 is fixed to and provided in the concave portion 341.

Figure 12:
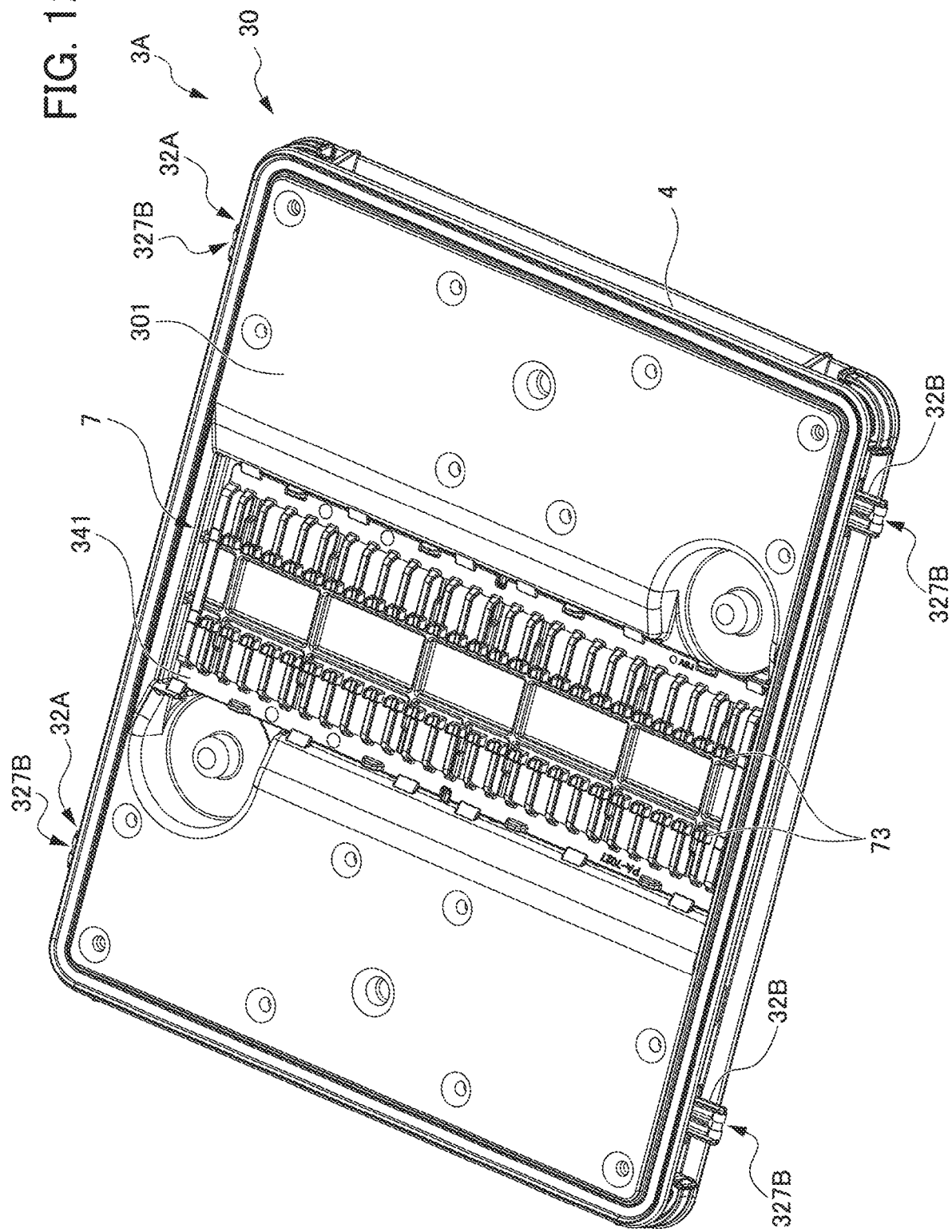
FIG. 12 is a front view illustrating an aspect of a lower side latch portion 32B projecting from the lid body 3 in a substrate storing container according to a second embodiment of the present invention.

The front retainer 7 has front retainer substrate receiving portions 73 (see FIG. 12). Two front retainer substrate receiving portions 73 are disposed so as to be spaced apart at a predetermined interval in the left/right direction D3 and form a pair. Twenty-five pairs of the front retainer substrate receiving portions 73 disposed in pairs as described above are provided in parallel in the upper lower direction D2. As the substrates W are stored in the substrate storing space 27 and the lid body 3 is closed, the front retainer substrate receiving portions 73 sandwich and support the end edges of the edge portions of the substrates W therebetween.

The latch driving portion of the lid body 3 of the substrate storing container having the above configuration operates as follows. First, as illustrated in FIG. 6, when the cylindrical convex portion 355 is located at the end portion in the counterclockwise direction of the elongated hole 312, the latch arm 32 is in the disengagement position. At this time, the tip end portions 322 of the latch arm 32 are brought into a state of not projecting from the through-holes 303A and 303B (see FIG. 1 and the like) formed in the circumferential wall portion 303 configuring the upper side of the lid body 3 in the upper direction D21 and the lower direction D22, respectively in addition, as illustrated in FIG. 7, the base portion of the latch arm 32 is supported by the base portion support portion 306 projecting from the inner plate-like portion 301 in the forward direction D11.

Next, as illustrated in FIG. 8, when the cylindrical convex portion 355 moves from the end portion in the counterclockwise direction of the elongated hole 312 to a position close to the end portion in the clockwise direction, the latch arm 32 is in the insertion position. At this time, the tip end portion 322 of the latch arm 32 projects from the through-holes 303A and 303B formed in the circumferential wall portion 303 of the lid body 3 in the upper direction D21 and the lower direction D22. In addition, as illustrated in FIG. 9, the base portion of the latch arm 32 is supported by the base portion support portion 306 as in a case where the latch arm 32 is in the disengagement position. Therefore, the tip fitting portions 324 of the latch arms 32 have not yet been moved in the forward direction D11, and the tip fitting portions 324 do not abut the parts of the opening circumferential portion 28 of the container main body 2 forming the latch engagement concave portions 231A, 231B, 241A, and 241B.

Next, when the cylindrical convex portion 355 approaches the end portion in the clockwise direction of the elongated hole 312, the latch arm 32 approaches the push-in position. At this time, as illustrated in FIG. 11, the base portion of the latch arm 32 is moved to a position that does not face a front face of the base portion support portion 306 such that the base portion of the latch arm 32 is not supported by the base portion support portion 306. At this time, the base portion of the latch arm 32 is supported by the connecting shaft 325 being supported by the latch lifting/lowering cam member 35, the connecting shaft 325 penetrating the elongated hole 357.

In addition, as the cylindrical convex portion 355 further approaches the end portion in the clockwise direction of the elongated hole 312, the connecting shaft 325 moves in the backward direction D12 along the elongated hole 357 extending obliquely. In addition, as illustrated in FIG. 10, when the cylindrical convex portion 355 is located at the end portion in the clockwise direction of the elongated hole 312, as illustrated in FIG. 11, the base portion of the latch arm 32 is brought into a state of falling from the base portion support portion 306 onto the inner plate-like portion 301. That is, the latch arms 32 rotate about the fulcrum portions 323, the base portions of the latch arms 32 move in the backward direction D12, the tip fitting portions 324 of the tip end portions 322 of the latch arms 32 move into the latch engagement concave portions 231A, 231B, 241A, and 241B in the forward direction D11, abut the parts of the opening circumferential portion 28 of the container main body 2 forming the latch engagement concave portions 231A, 231B, 241A, and 241B, and push the parts relative to the lid body 3 in the forward direction D11. Accordingly, the lid body 3 is pushed relative to the container main body 2 in the backward direction D12, so that the container main body opening portion 21 is closed by the lid body 3.

According to the substrate storing container 1 according to the present embodiment having the above configuration, the following effects can be obtained. As described above, the latching mechanism of the substrate storing container 1 includes: the latch arms 32 as the engagement latches which are engaged/disengaged by advancing to and retreating from the latch engagement concave portions 231A, 231B, 241A, and 241B as engagement concave portions and move toward/away from the other end portion with respect to one end portion of the container main body 2 in the latch engagement concave portions 231A, 231B, 241A, and 241B; the latch lifting/lowering cam members 35 as the engagement latch lifting/lowering cams which cause the latch arms 32 to advance to and retreat from the latch engagement concave portions 231A, 231B, 241A, and 241B and cause the latch arms 32 in the latch engagement concave portions 231A, 231B, 241A, and 241B to move toward/ away from the other end portion of the container main body 2 by advancing and retreating in a direction in which the latch arms 32 advance and retreat; and the latch rotating member 31 as the rotating cam which causes the latch lifting/lowering cam members 35 to advance and retreat in a direction in which the latch arms 32 advance and retreat by rotating. The latch lifting/lowering cam members 35 include the elongated holes 357 as the engagement latch connection portions which cause the latch arms 32 to be engaged with the latch engagement concave portions 231A, 231B, 241A, and 241B and thereafter cause the latch arms 32 to approach the other end portion of the container main body 2 by moving in a direction in which the latch arms 32 approach the latch engagement concave portions 231A, 231B, 241A, and 241B.

With the above configuration, parts where the latch arms 32, the latch lifting/lowering cam members 35, the latch rotating members 31, and the lid body main body 30 slide against one another can be reduced. In addition, since the parts of the opening circumferential portion 28 of the container main body 2 forming the latch engagement concave portions 231A, 231B, 241A, and 241B are pushed relative to the lid body 3 in the forward direction D11 by moving the latch arms 32 in the forward direction D11 after the latch arms 32 are engaged with the latch engagement concave portions 231A, 231B, 241A, and 241B, as the pushing force, the principle of leverage when the latch arms 32 are rotated can be used. From these facts, it becomes possible to rotate the latch rotating member 31 of an operation portion 33 of the lid body 3 with less rotational force.

Furthermore, since the parts which slide against each other can be reduced, it is possible to suppress generation of particles, and it becomes possible to suppress infiltration of particles into the substrate storing space 27.

Figure 13:
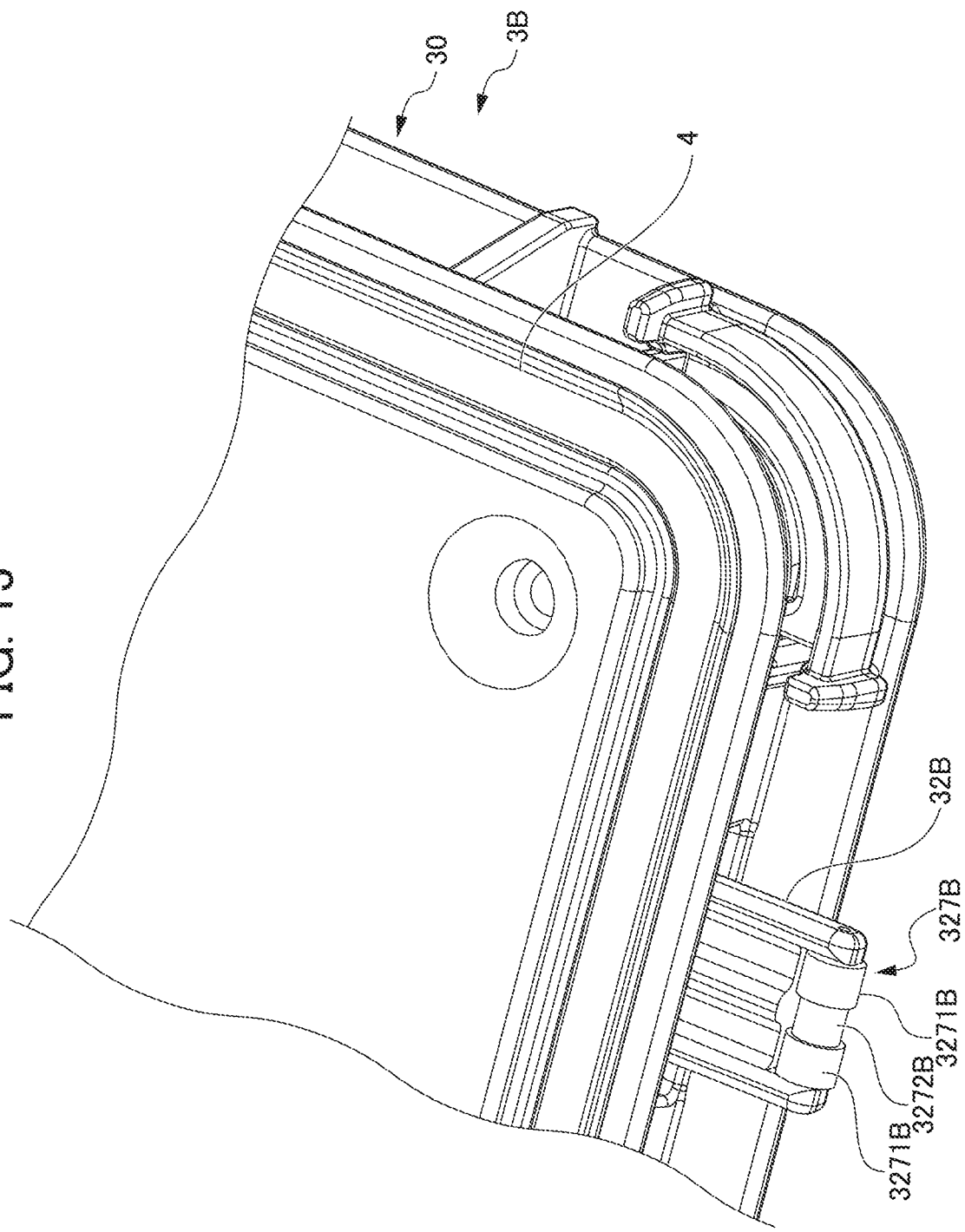
FIG. 13 is an enlarged perspective view illustrating an aspect of the lower side latch portion 32B projecting from the lid body 3 in the substrate storing container according to the second embodiment of the present invention.

Next, a substrate storing container according to a second embodiment of the present invention will be described with reference to the drawings. FIG. 12 is a front view illustrating an aspect of a lower side latch portion 32B projecting from the lid body 3 in the substrate storing container. FIG. 13 is an enlarged perspective view illustrating an aspect of the lower side latch portion 32B projecting from the lid body 3 in the substrate storing container.

In the second embodiment, the configurations of an upper side latch portion 32A and the lower side latch portion 325 are different from the configurations of an upper side latch portion 32A and a lower side latch portion 32B in the first embodiment. Since the other configurations are the same as those in the first embodiment, like elements are denoted by like reference numerals, and description thereof will be omitted.

Tip end portions of the upper side latch portion 32A and the lower side latch portion 32B are respectively provided with locking rollers 327B which are engaged with and locked to the latch engagement concave portions 231A, 231B, 241A, and 241B (see FIG. 1). As illustrated in FIG. 13, the locking roller 327B includes a rotation shaft portion (not illustrated), a pair of end portion large diameter portions 3271B which rotates integrally with the rotation shaft portion, and a central small diameter portion 3272B which is located between the pair of end portion large diameter portions 32715, and these are configured to be integrally molded.

The end portion large diameter portions 3271B of the locking rollers 327E abut the parts of the opening circumferential portion 28 of the container main body 2 forming the latch engagement concave portions 231A, 231B, 241A, and 241B (see FIG. 1) after the latch arms 32 are inserted into the latch engagement concave portions 231A, 231B, 241A, and 241B in the insertion position. With this configuration, since the locking rollers 3273 that abut the parts can rotate, it becomes possible to suppress sliding of the parts, the upper side latch portion 32A, and the lower side latch portion 32B, and it becomes possible to suppress generation of particles.

Figure 14:
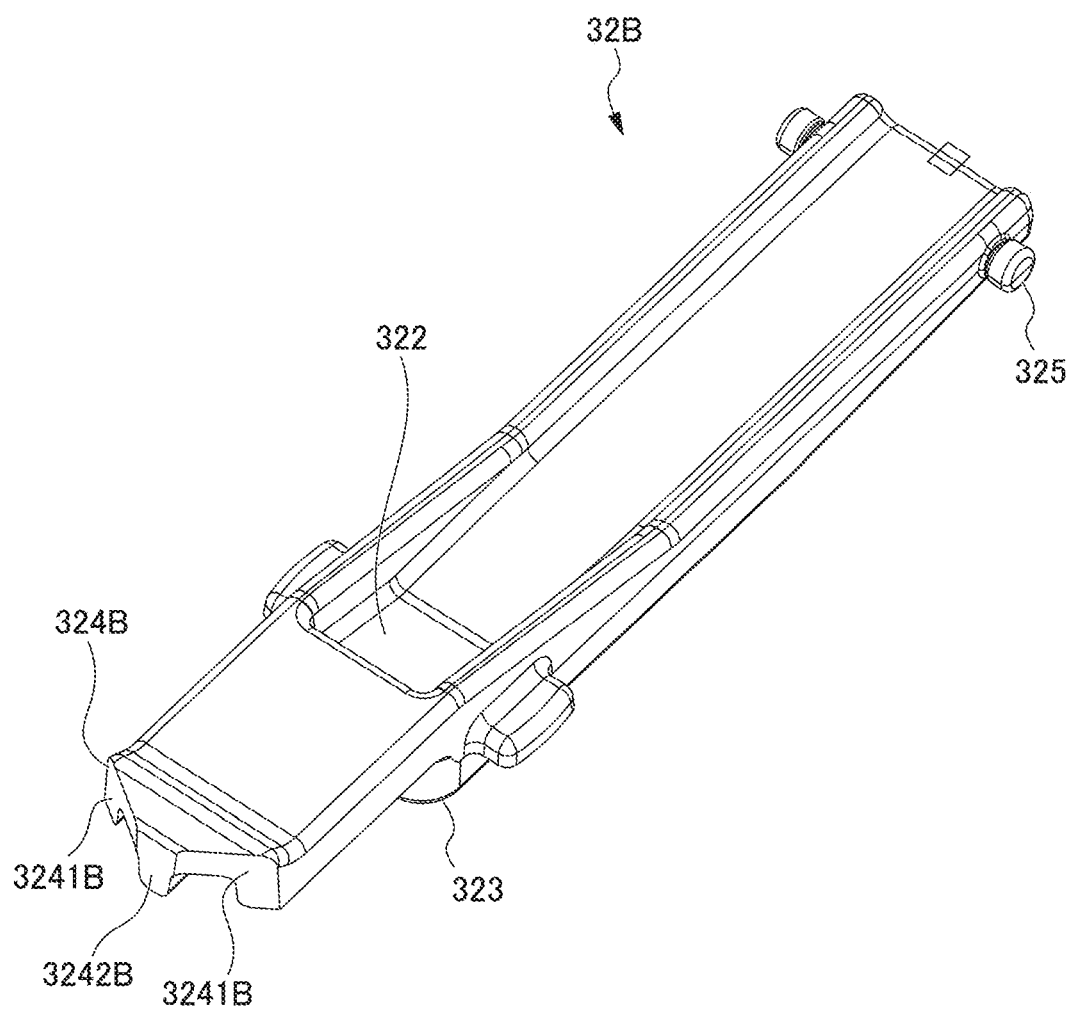
FIG. 14 is a perspective view illustrating a latch arm 32B in a substrate storing container according to a third embodiment of the present invention.

Next, a substrate storing container according to a third embodiment of the present invention will be described with reference to the drawings. FIG. 14 is a perspective view illustrating a latch arm 32B in the substrate storing container.

In the third embodiment, the configuration of a tip fitting portion 3248 of the latch arm 32B is different from the configuration of the tip fitting portion 324 of the latch arm 32 in the first embodiment. Since the other configurations are the same as those in the first embodiment, like elements are denoted by like reference numerals, and description thereof will be omitted.

A length in a longitudinal direction of the latch arm 323 is longer than a length in a longitudinal direction of the latch arm 32 in the first embodiment. The tip fitting portion 324B of the latch arm 32B has a V-shaped end face. The V-shaped end face projects in a direction away from the latch rotating member 31. The V-shaped end face includes a tip abutting portion face 3242B, and a pair of deviation prevention faces 32418. The tip abutting portion face 32428 is configured by a face of a central part of the V-shaped end face in the left/right direction D3. The pair of deviation prevention faces 3241B is located on both sides of the tip abutting portion face 3242B substantially in the left/right direction D3.

Regarding this, the bottom portion (not illustrated) of the latch engagement concave portion of the container main body of the substrate storing container has a shape that matches the tip fitting portion 324B of the latch arm 32B. The latch arm 32A and the bottom portion of the latch engagement concave portion with which the latch arm 32A is engaged also have the same configurations.

With this configuration, it becomes possible to engage the tip fitting portion 324B of the latch arm 32B with the bottom portion of the latch engagement concave portion. Accordingly, the latch arm 32B and the like can be positioned with respect to the latch engagement concave portions 241B and the like in a direction parallel to the lid body outer face or the lid body inner face (a direction parallel to the upper/lower direction D2 and the left/right direction D3), and deviation of the latch arm 32B and the like from the latch engagement concave portions 241B and the like in the same direction can be suppressed.

The present invention is not limited to the abovementioned embodiments, and modifications thereto within the technical scope claimed in the claims are possible.

For example, the tip fitting portion 324 of the latch arm 32 as the tip end portion of the engagement latch can be made of a material having a low coefficient of static friction. Alternatively, the tip fitting portion 324 of the latch arm 32 as the tip end portion of the engagement latch can be subjected to embossment. With such a configuration, due to sliding between the tip fitting portion of the latch arm and the parts of the opening circumferential portion of the container main body forming the latch engagement concave portions, it becomes possible to suppress generation of particles.

In addition, although the latch arm 32 is integrally molded with a POM (polyacetal) resin as the main component, the latch arm 32 is not limited to being formed of a POM (polyacetal) resin as the main component. For example, the latch arm 32 may be molded with a PEEK resin as the main component.

For example, the shapes of the container main body and the lid body, the number and dimensions of substrates that can be stored in the container main body are not limited to the shapes of the container main body 2 and the lid body 3 in the present embodiment, and the number and dimensions of substrates W that can be stored in the container main body 2. In addition, although the substrate W in the present embodiment is a silicon wafer having a diameter of 300 mm, the diameter is limited to this value.

Furthermore, in the present embodiment, the back side substrate support portion has the back side end edge support portions 60 configured to be integrally formed with the container main body 2 at the rear end portion of the plate portions 51 of the substrate support plate-like portions 5, but is not limited to this configuration. For example, the back side substrate support portion may not be configured to be integrally formed with the container main body and may be configured separately.

In addition, in the present embodiment, the through-holes at the two points of the front portion of the lower wall 24 are the exhaust holes 243 through which the gas inside the container main body 2 is discharged, and the through-holes at the two points of the rear portion thereof are the supply holes 242 through which the gas is supplied into the container main body 2. However, the through-holes are not limited to this configuration. For example, at least one of the two through-holes of the front portion of the lower wall may be a supply hole through which the gas is supplied into the container main body.

EXPLANATION OF REFERENCE NUMERALS

1 SUBSTRATE STORING CONTAINER
2 CONTAINER MAIN BODY
3 LID BODY
21 CONTAINER MAIN BODY OPENING PORTION
27 SUBSTRATE STORING SPACE
28 OPENING CIRCUMFERENTIAL PORTION
30 LID BODY MAIN BODY
31 LATCH ROTATING MEMBER (ROTATING CAM, LATCHING MECHANISM)
32 LATCH ARM (ENGAGEMENT LATCH, LATCHING MECHANISM)
35 LATCH LIFTING/LOWERING CAM MEMBER (ENGAGEMENT LATCH LIFTING/LOWERING CAM, LATCHING MECHANISM)
231A, 231B, 241A, 241B LATCH ENGAGEMENT CONCAVE PORTION
327B LOCKING ROLLER
357 ELONGATED HOLE (ENGAGEMENT LATCH CONNECTION PORTION)
W SUBSTRATE

The invention claimed is:
1. A substrate storing container comprising:
a container main body having formed inside thereof a substrate storing space that can store a plurality of substrates, and having formed at one end portion thereof an opening circumferential portion at which a container main body opening portion that is in communication with the substrate storing space is formed; and
a lid body that is removably attached to the opening circumferential portion and can close the container main body opening portion in a positional relationship surrounded by the opening circumferential portion,
wherein the opening circumferential portion includes a pair of engagement concave portions that has a positional relationship opposite to each other and is formed to face the lid body,
the lid body includes
a lid body main body, and
a pair of latching mechanisms that is able to move with respect to the lid body main body between an engagement position where the pair of latching mechanisms are respectively engaged with the pair of engagement concave portions to fix the lid body main body to the container main body, and a disengagement position where engagement with the engagement concave portions is released and fixing of the lid body main body to the container main body is released, when the container main body opening portion is closed by the lid body,
the pair of latching mechanism includes
engagement latches that are engaged/disengaged by advancing to and retreating from the pair of engagement concave portions and move toward/away from the other end portion with respect to the one end portion of the container main body in the pair of engagement concave portions, engagement latch lifting/lowering cams that cause the engagement latches to advance to and retreat from the pair of engagement concave por- tions and cause the engagement latches in the pair of engagement concave portions to move toward/away from the other end portion of the container main body by advancing and retreating in a direction in which the engagement latches advance and retreat, and a rotating cam that causes the engagement latch lifting/lowering cams to advance and retreat in the direction in which the engagement latches advance and retreat by rotating, and the engagement latch lifting/lowering cams include engagement latch connection portions that cause the engagement latches to be engaged with the pair of engagement concave portions and thereafter cause the engagement latches to approach the other end portion of the container main body by moving in a direction in which the engagement latches approach the pair of engagement concave portions and thereby a rotational force for rotating the rotating cam, sliding of the plurality of the substrates against each other and infiltration of particles inside the substrate storing container are reduced.

2. The substrate storing container according to claim 1, wherein a locking roller which is engaged with and locked to each of the pair of engagement concave portions is provided in a tip end portion of each of the engagement latches.

3. The substrate storing container according to claim 1, wherein the lid body has a rectangular plate shape having a lid body outer face and a lid body inner face, a bottom portion of each of the pair of engagement concave portions has a V shape in a section parallel to the lid body outer face or the lid body inner face, and a part which is a part of a tip end portion of each of the engagement latches and abuts a part of an engagement concave portion forming portion of the opening circumferential portion forming the bottom portion of each of the pair of engagement concave portions when each of the engagement latches is in the engagement position has a V-shaped end face that matches the bottom portion of each of the pair of engagement concave portions.

4. The substrate storing container according to claim 2, wherein the tip end portion of each of the engagement latches is made of a material having a low coefficient of static friction.

5. The substrate storing container according to claim 4, wherein the tip end portion of each of the engagement latches has a low coefficient of static friction by being subjected to embossment.

* * * * *